US011910554B2

(12) United States Patent
Arduini et al.

(10) Patent No.: US 11,910,554 B2
(45) Date of Patent: Feb. 20, 2024

(54) MODULAR AND PLUGGABLE PDU TO POWER TRAY/SHELF DEVICE

(71) Applicant: Cisco Technology, Inc., San Jose, CA (US)

(72) Inventors: Douglas P. Arduini, San Ramon, CA (US); Sung K. Baek, San Ramon, CA (US)

(73) Assignee: Cisco Technology, Inc., San Jose, CA (US)

( * ) Notice: Subject to any disclaimer, the term of this patent is extended or adjusted under 35 U.S.C. 154(b) by 222 days.

(21) Appl. No.: 17/448,978

(22) Filed: Sep. 27, 2021

(65) Prior Publication Data

US 2022/0271513 A1 Aug. 25, 2022

Related U.S. Application Data

(60) Provisional application No. 63/200,950, filed on Apr. 5, 2021, provisional application No. 63/200,518, filed on Mar. 11, 2021, provisional application No. 63/200,230, filed on Feb. 23, 2021.

(51) Int. Cl.
| | |
|---|---|
| *H05K 7/14* | (2006.01) |
| *G06F 1/18* | (2006.01) |
| *H01R 13/639* | (2006.01) |
| *H01R 25/00* | (2006.01) |
| *H02B 1/04* | (2006.01) |

(52) U.S. Cl.
CPC ......... *H05K 7/1457* (2013.01); *H01R 13/639* (2013.01); *H01R 25/006* (2013.01); *H02B 1/04* (2013.01); *G06F 1/189* (2013.01)

(58) Field of Classification Search
CPC .............................. H05K 7/1457; G06F 1/189
See application file for complete search history.

(56) References Cited

U.S. PATENT DOCUMENTS

| | | | | |
|---|---|---|---|---|
| 5,821,636 A | * | 10/1998 | Baker ....................... | H02J 3/38 307/64 |
| 6,937,461 B1 | * | 8/2005 | Donahue, IV ....... | H01R 13/514 174/59 |
| 7,268,998 B2 | * | 9/2007 | Ewing .................. | H05K 7/1492 174/59 |
| 7,365,964 B2 | * | 4/2008 | Donahue, IV ....... | H01R 13/514 439/55 |
| 8,708,736 B2 | * | 4/2014 | Bailey ..................... | G06F 1/26 439/535 |

(Continued)

*Primary Examiner* — Robert J Hoffberg
(74) *Attorney, Agent, or Firm* — Patterson + Sheridan, LLP

(57) ABSTRACT

Implementations are described for a modular power distribution unit (PDU) for a rack-mountable power tray or power shelf. The modular PDU includes a housing defining an input face and an opposing output face, and a plurality of power cables extending to the input face. The modular PDU further includes one or more second power connectors arranged at the output face, and distribution circuitry configured to distribute power from a first power bus and a second power bus to the one or more second power connectors. The modular PDU further includes one or more fasteners configured to attach the output face of the housing to the face of the power tray or power shelf, wherein the one or more second power connectors are retained in a coupled configuration with the one or more first power connectors.

20 Claims, 24 Drawing Sheets

(56) References Cited

U.S. PATENT DOCUMENTS

| | | | | |
|---|---|---|---|---|
| 8,902,569 | B1* | 12/2014 | Wishman | G06F 1/26 |
| | | | | 361/622 |
| 8,972,752 | B2* | 3/2015 | Bailey | G06F 1/30 |
| | | | | 713/340 |
| 9,172,219 | B2* | 10/2015 | Mills | G06F 1/26 |
| 9,209,622 | B2* | 12/2015 | Wishman | G06F 1/26 |
| 9,270,089 | B2* | 2/2016 | Bailey | G06F 1/26 |
| 9,438,012 | B2* | 9/2016 | Mills | G06F 1/26 |
| 9,466,954 | B1 | 10/2016 | Stevens et al. | |
| 9,661,777 | B2* | 5/2017 | Mills | H02B 1/26 |
| 10,932,388 | B1 | 2/2021 | Davis et al. | |
| 11,716,825 | B2* | 8/2023 | Gartenlaub | H01R 25/006 |
| | | | | 361/622 |
| 2007/0281526 | A9 | 12/2007 | Donahue | |
| 2008/0093927 | A1 | 4/2008 | Ewing et al. | |
| 2020/0137914 | A1 | 4/2020 | Smith et al. | |
| 2022/0385045 | A1* | 12/2022 | Gartenlaub | H05K 7/1438 |

\* cited by examiner

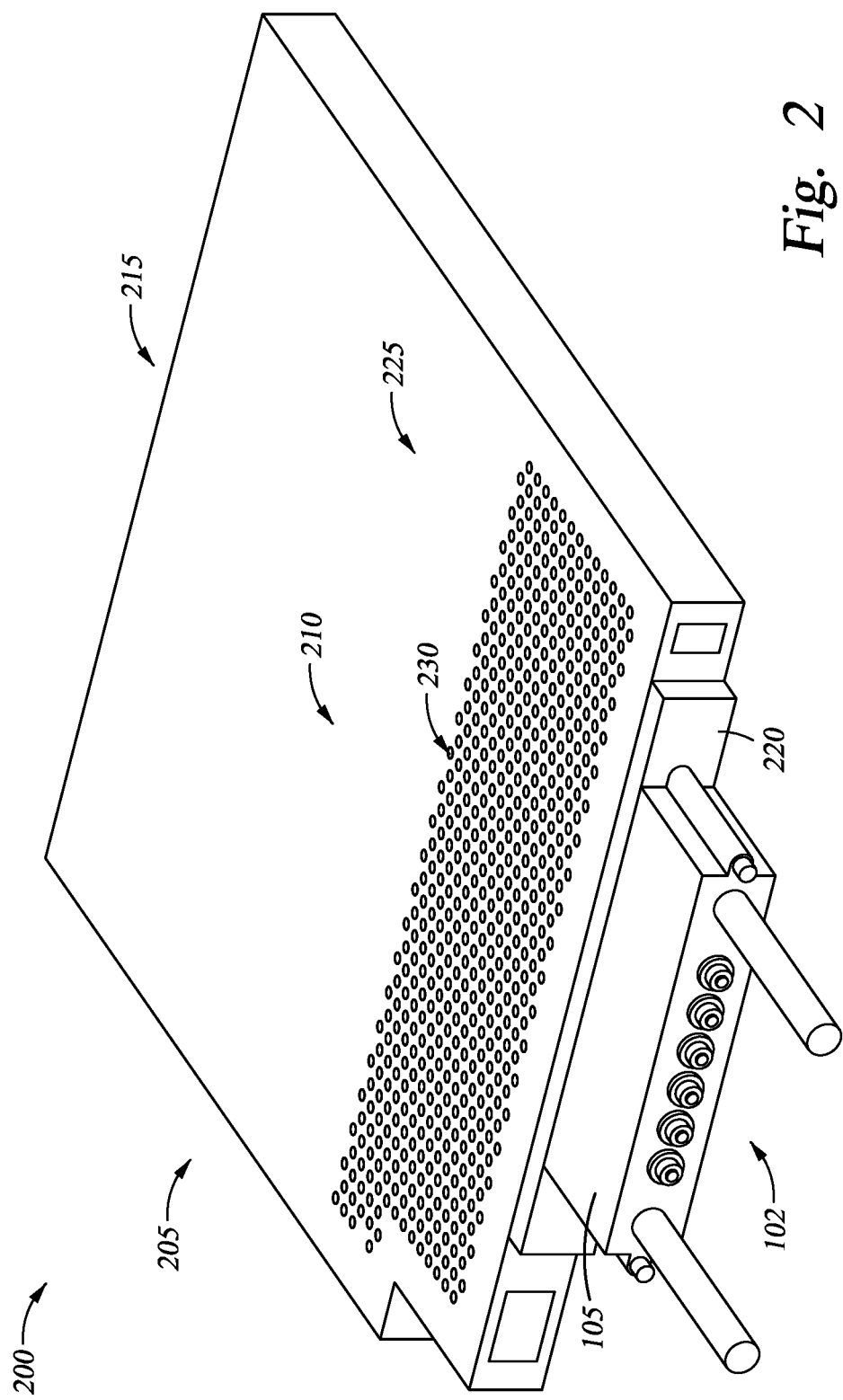

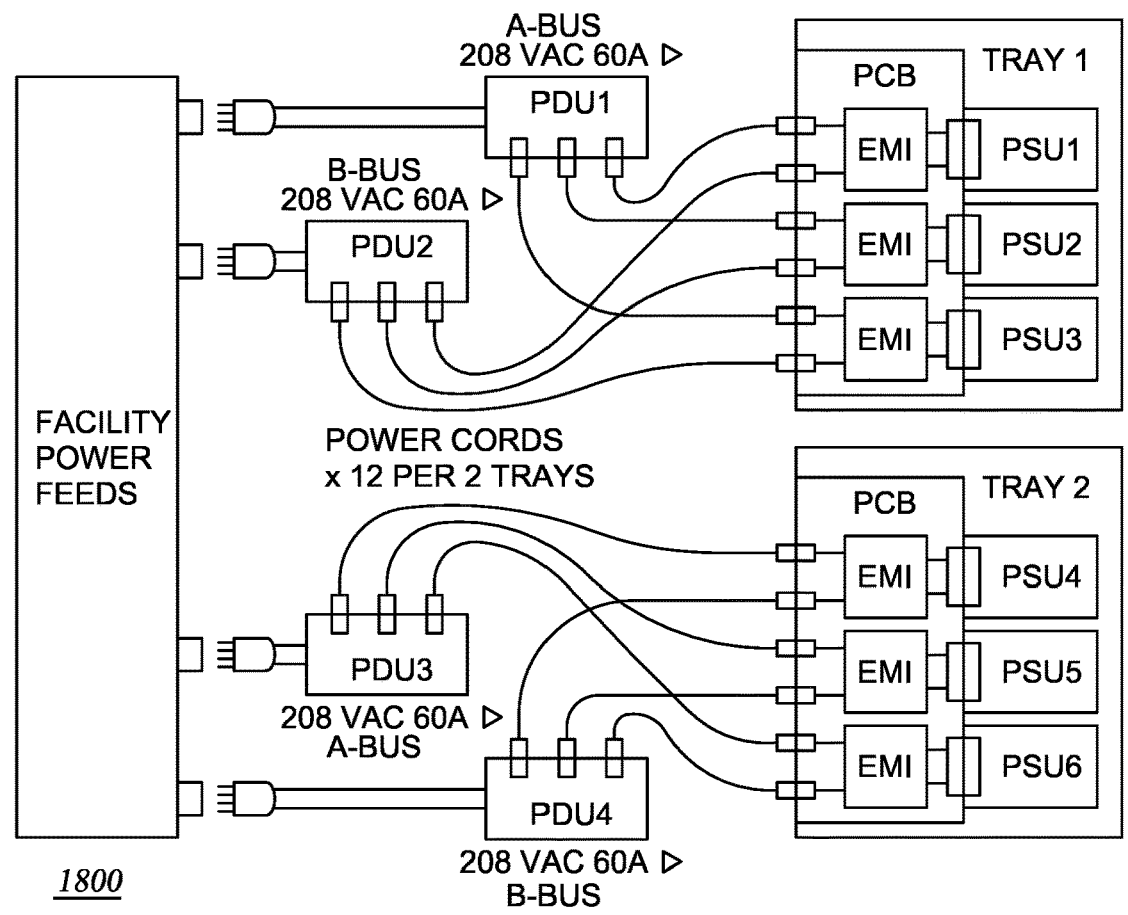
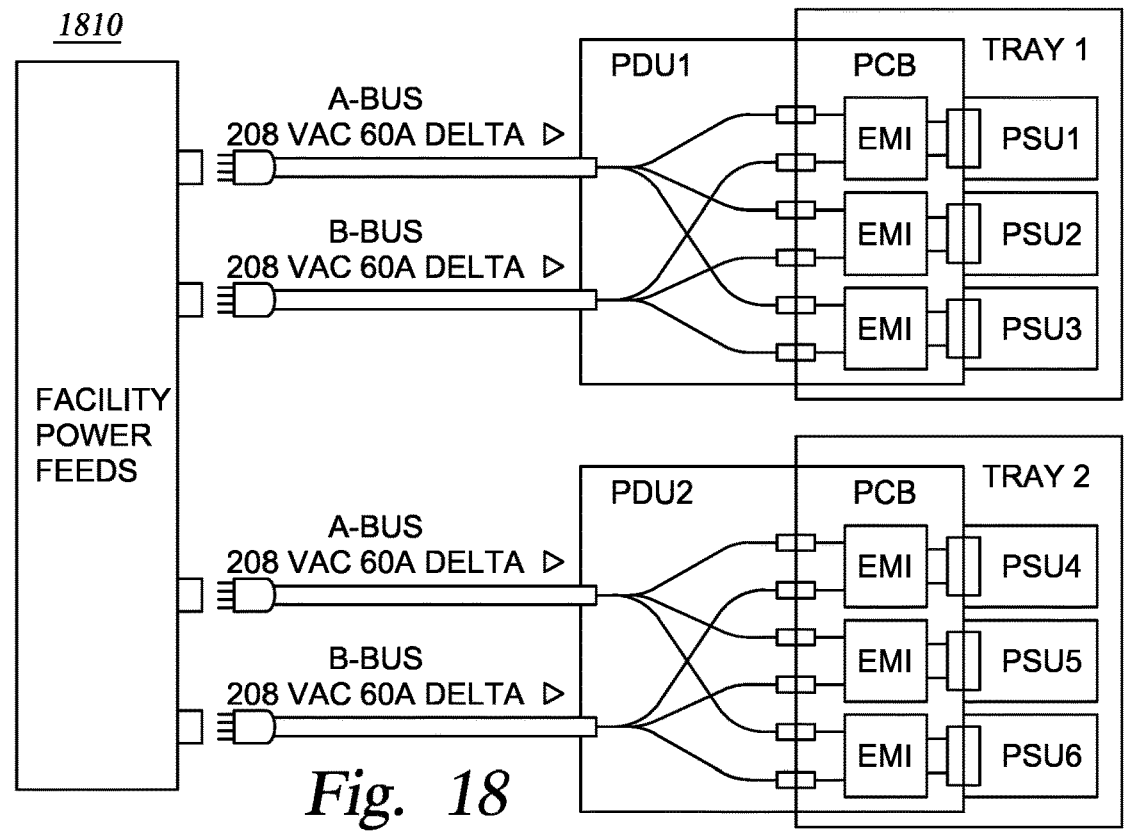
Fig. 18

US 11,910,554 B2

MODULAR AND PLUGGABLE PDU TO POWER TRAY/SHELF DEVICE

CROSS-REFERENCE TO RELATED APPLICATIONS

This application claims benefit of U.S. provisional patent applications: Ser. No. 63/200,230 (filed Feb. 23, 2021), Ser. No. 63/200,518 (filed Mar. 11, 2021), and Ser. No. 63/200,950 (filed Apr. 5, 2021). The aforementioned related patent applications are herein incorporated by reference in their entirety.

TECHNICAL FIELD

Embodiments presented in this disclosure generally relate to power supplies for rack-mounted power trays or power shelves, and more specifically, implementations of integrated modular power distribution units (PDUs) such as examples for the rack-mounted power trays or power shelves.

BACKGROUND

Advancements in network equipment such as routers and switches may require greater power levels (e.g., voltages and/or currents) that are not currently supported in facilities and data centers. Further, these greater power levels may require the development and use of specialized connectors and/or PDUs for connection to rack-mounted power supply units (PSUs).

Conventional PDU designs tend to occupy large amounts of rack space and require numerous power cables, which complicate cable management and tend to interfere with serviceability and cooling of the rack-mounted PSUs. It can also be costly to develop and qualify the new PDUs and the power cables for operation in different countries, which may specify different cable types, connectors, voltages, and/or currents for various power requirements. Further, it can be difficult to achieve phase current balancing on three-phase power feeds from using conventional multiple PDUs for rack power systems.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIG. 2 illustrates a coupled configuration of a modular power distribution unit and a rack-mountable power tray, according to one or more embodiments.

FIG. 18 illustrates multiple rack-mounted power trays coupled with modular power distribution units, according to one or more embodiments.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1A:
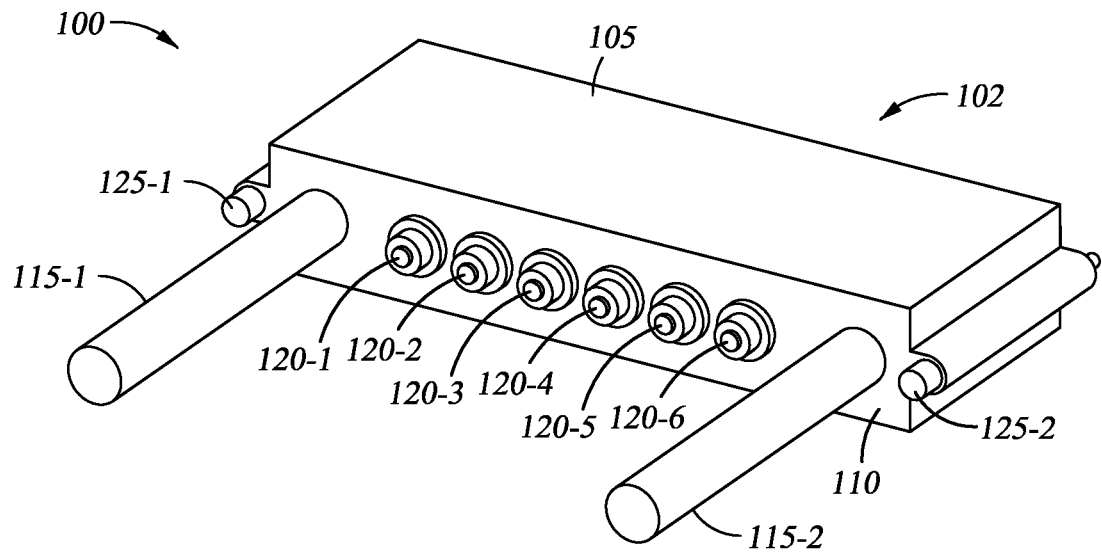
FIGS. 1A and 1B are perspective views of a modular power distribution unit, according to one or more embodiments.

One embodiment presented in this disclosure is a system comprising a rack-mountable power tray or power shelf comprising a plurality of power supply units (PSUs) and one or more first power connectors arranged at a face of the power tray or power shelf and coupled to the PSUs. The system further comprises a modular power distribution unit (PDU) comprising a housing defining an input face and an opposing output face, and a plurality of power cables extending to the input face. The plurality of power cables comprises a first power cable of a first power bus and a second power cable of a second power bus. The modular PDU further comprises one or more second power connectors arranged at the output face, distribution circuitry configured to distribute power from the first power bus and the second power bus to the one or more second power connectors, and one or more fasteners configured to attach the output face of the housing to the face of the power tray or power shelf. The one or more second power connectors are retained in a coupled configuration with the one or more first power connectors.

Another embodiment presented in this disclosure is a modular power distribution unit (PDU) to distribute power to a plurality of power supply units (PSUs) arranged in a rack-mountable power tray or power shelf. The modular PDU comprises a housing configured to receive, at an input face, a plurality of power cables comprising a first power cable of a first power bus, and a second power cable of a second power bus. The modular PDU further comprises one or more first power connectors arranged at an output face of the housing opposite the input face. The one or more first power connectors are arranged to couple with one or more second power connectors of the power tray or power shelf, and distribution circuitry within the housing. The distribution circuitry is configured to distribute power from the first power bus and from the second power bus to each of the plurality of PSUs via a respective one or more of the first power connectors.

Another embodiment presented in this disclosure is a modular power distribution unit (PDU) to distribute power to a plurality of power supply units (PSUs) arranged in a rack-mountable power tray or power shelf. The modular PDU comprises a housing configured to receive, at an input face, a plurality of power cables comprising a first power cable of a first power bus, and a second power cable of a second power bus. The modular PDU further comprises a plurality of electronic or electro-mechanical circuit breakers. Each of the circuit breakers has electronic ganging control between different phases of power of one of the first power bus and the second power bus. The modular PDU further comprises one or more first power connectors arranged at an output face of the housing opposite the input face. The one or more first power connectors are arranged to couple with one or more second power connectors of the power tray or power shelf.

Example Embodiments

Embodiments described herein include implementations of a modular PDU that couples to a power tray (or a power shelf) and includes a minimal number of power cables. In some embodiments, the modular PDU is directly pluggable into the power tray, and in some cases may be retained in a coupled configuration using one or more fasteners that attach the modular PDU to a face of the power tray or the power shelf.

Beneficially, the modular PDU may provide improved efficiency, as the power losses of the power cables is reduced. The modular PDU may eliminate the need for numerous power cables to each power supply input. The modular PDU may reduce or eliminate costs associated with developing new PDUs, new power cables, and/or new power connectors to support the greater power levels. The modular PDU may conserve rack space and may support improved system serviceability and cooling. A three-phase implementation of the modular PDU may support phase current balancing for power trays having, e.g., three or six PSUs.

Figure 1B:
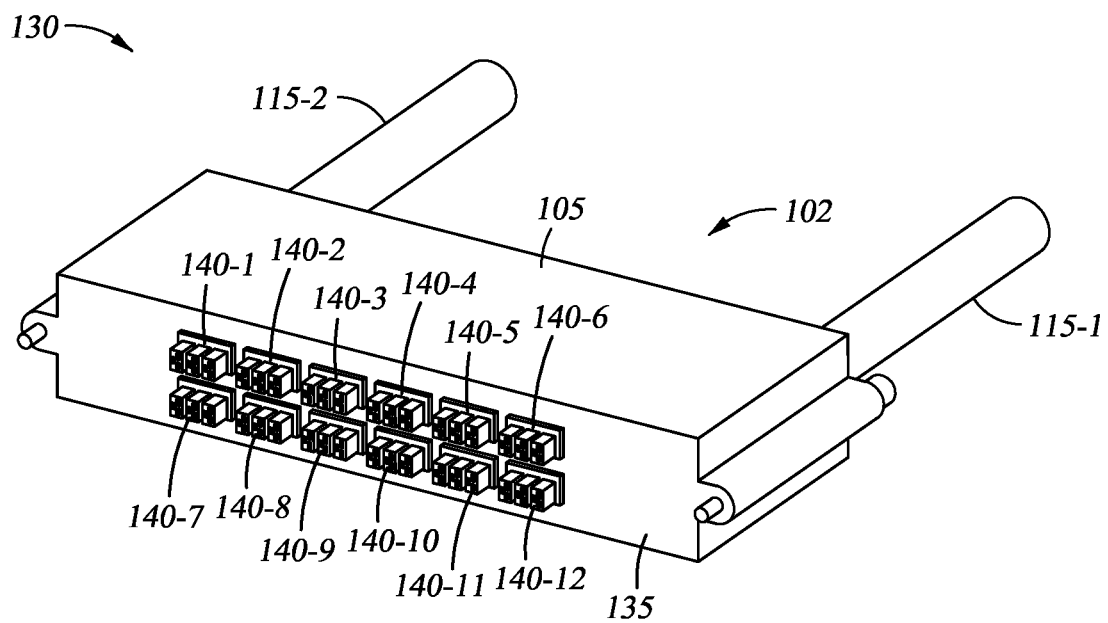

FIGS. 1A and 1B are perspective views 100, 130 of a modular power distribution unit (PDU) 102. The modular PDU 102 comprises a housing 105 defining an input face 110 and an opposing output face 135. In some embodiments, each of the input face 110 and the output face 135 are substantially planar.

The modular PDU 102 further comprises a plurality of power cables 115-1, 115-2 extending to the input face 110. The power cables 115-1, 115-2 may represent input power cables from redundant input power feeds. In some embodiments, the plurality of power cables comprises a first power cable 115-1 of a first power bus and a second power cable 115-2 of a second power bus. In some embodiments, the first power bus and the second power bus each provide three-phase power.

In some embodiments, the plurality of power cables 115-1, 115-2 comprises a plurality of pendant cables that extend into the housing 105 through the input face 110. In some embodiments, the plurality of power cables 115-1, 115-2 couple to a plurality of power connectors that are arranged at the input face 110.

The modular PDU 102 further comprises a plurality of power connectors 140-1, ..., 140-6, 140-7, ..., 140-12 that are arranged at the output face 135, as well as distribution circuitry (not shown) that is arranged within the housing 105 and that distributes power from the first power bus and the second power bus to the plurality of power connectors 140-1, ..., 140-12.

In some embodiments, a count of the plurality of power connectors 140-1, ..., 140-12 is greater than a count of the plurality of power cables 115-1, 115-2. As shown, the plurality of power connectors 140-1, ..., 140-12 are arranged into two (2) rows, although different numbers and arrangements of the power connectors 140-1, ..., 140-12 are also contemplated. In some alternate embodiments, the modular PDU 102 may include a single power connector at the output face 135.

In some embodiments, the distribution circuitry distributes a respective phase from one of the first power bus and the second power bus to each power connector of the plurality of power connectors 140-1, ..., 140-12. The distribution circuitry includes suitable wiring and may include additional components. In some embodiments, the distribution circuitry comprises a plurality of electronic circuit breakers 120-1, ..., 120-6 with electronic ganging control between different phases of power. In some embodiments, the different phases correspond to the first power bus and the second power bus. In some embodiments, each of the plurality of electronic circuit breakers 120-1, ..., 120-6 comprises a respective local switch arranged at the input face 110. Beneficially, the use of electronic circuit breakers 120-1, ..., 120-6 allows for a more compact implementation of the modular PDU 102, although other types of circuit breakers are also contemplated such as mechanical and electro-mechanical circuit breakers.

Thus, the modular PDU 102 may receive dual three-phase power inputs and provide N+N redundant power connections to support six (6) PSUs. The modular PDU 102 may include six (6) single-phase electronic circuit breakers, implemented as pushbutton switches, that are electrically ganged for tripping internally.

In some embodiments, the modular PDU 102 further comprises interlock connectors (not shown) at the output face 135 that couple with interlock connectors of the power tray. In some embodiments, identification information is transmitted using the interlock connectors to enable power delivery from the PDU to the PSUs of the power tray. In some embodiments, detaching the interlock connectors of the modular PDU 102 from the power tray disables power delivery from the PDU to the PSUs of the power tray.

The modular PDU 102 further comprises one or more fasteners 125-1, 125-2 that are received into a face of a power tray (or power shelf). The one or more fasteners 125-1, 125-2 attach the output face 135 to the face of the power tray, such that the plurality of power connectors 140-1, ..., 140-12 are retained in a coupled configuration with a plurality of power connectors arranged at the face of the power tray, and the interlock connectors are retained in a coupled configuration when the output face 135 is attached to the face of the power tray. One non-limiting example of the one or more fasteners 125-1, 125-2 include jackscrews.

The housing 105 may be formed of any suitable material(s) providing sufficient rigidity for coupling to the power cables 115-1, 115-2 and to the power tray. The housing 105 may also act as a heatsink for the plurality of electronic circuit breakers 120-1, ..., 120-6 to the outside air by natural convention, or with additional cooling from the forced air exit from the PSUs' internal fans through the power tray or the power shelf. In some embodiments, the housing 105 is formed of aluminum with hardening for mechanical strength and rigidity.

FIG. 2 illustrates a coupled configuration of a modular power distribution unit and a rack-mountable power tray 205 (also referred to as power tray 205). The features illustrated in diagram 200 may be used in conjunction with other embodiments, such as the modular PDU 102 of FIG. 1.

The power tray 205 comprises a housing 210 defining a front face 215, an opposing rear face 220, and a top surface 225 extending between the front face 215 and the rear face 220. One or more PSUs are arranged in the housing 210 and are accessible through the front face 215. Vent holes 230 may be formed in the top surface 225 near the rear face 220 in this example.

The fasteners 125-1, 125-2, are received into openings of the rear face 220, such that the modular PDU 102 is attached to the power tray 205 at the rear face 220. Power connectors and/or interlock connectors of the modular PDU 102 are retained in a coupled configuration with corresponding power connectors and/or interlock connectors of the power tray 205.

Figure 3:
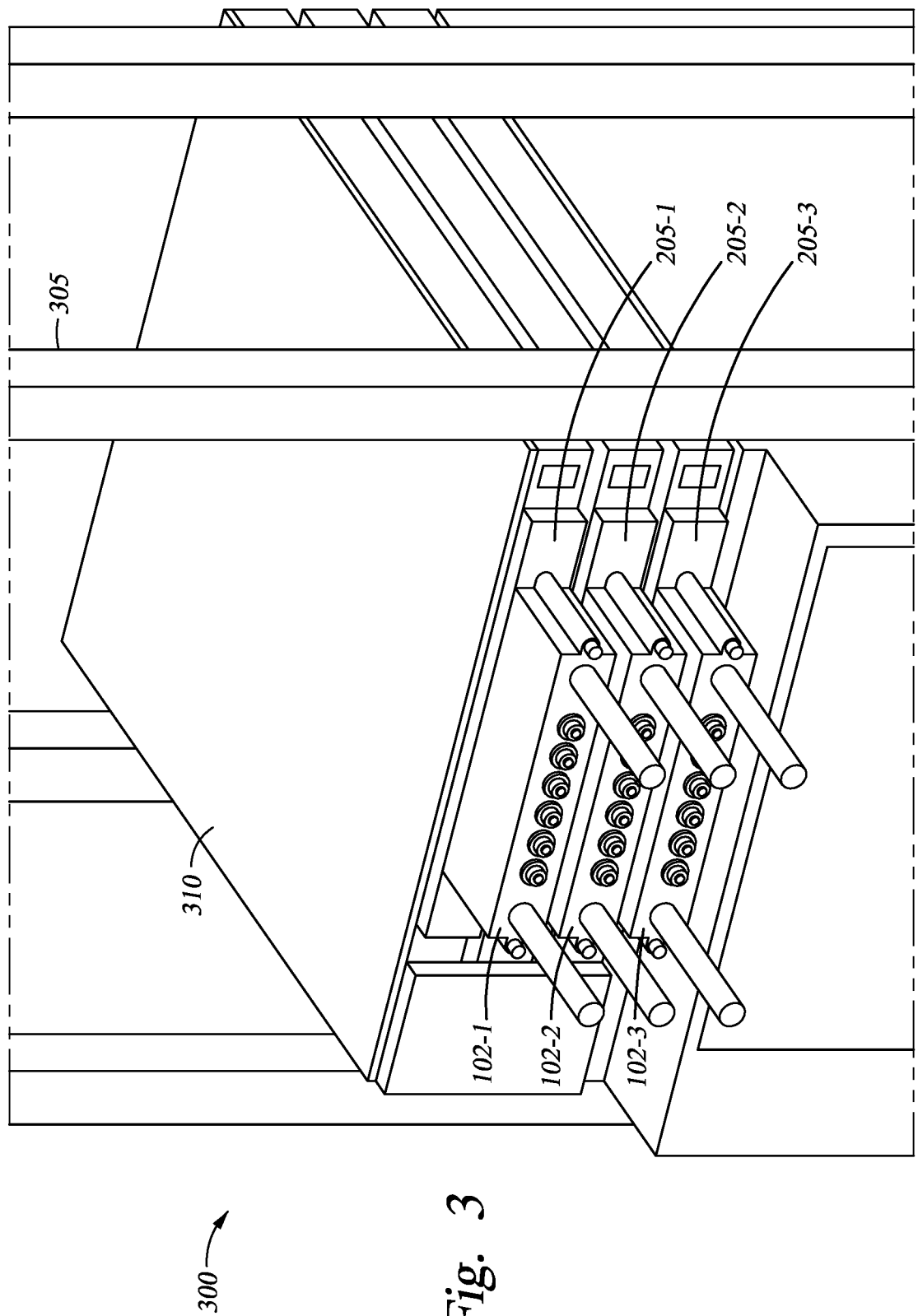
FIG. 3 illustrates multiple rack-mounted power trays coupled with modular power distribution units, according to one or more embodiments.

FIG. 3 illustrates multiple rack-mounted power trays 205-1, 205-2, 205-3 coupled with modular PDUs 102-1, 102-2, 102-3. The features illustrated in diagram 300 may be used in conjunction with other embodiments. For example, the modular PDUs 102-1, 102-2, 102-3 represent multiple instances of the modular PDU 102 of FIG. 1, and the power trays 205-1, 205-2, 205-3 represent multiple instances of the power tray 205 of FIG. 2.

In the diagram 300, the rack 305 comprises any suitable frame structure, whether in a standard or proprietary size. Beneath a top surface 310, the rack-mounted power trays 205-1, 205-2, 205-3 are coupled with modular PDUs 102-1, 102-2, 102-3. Networking hardware (e.g., routers, switches) and/or other computing hardware may also be mounted to the rack 305, and powered by various PSUs in the power trays 205-1, 205-2, 205-3.

Figure 4:
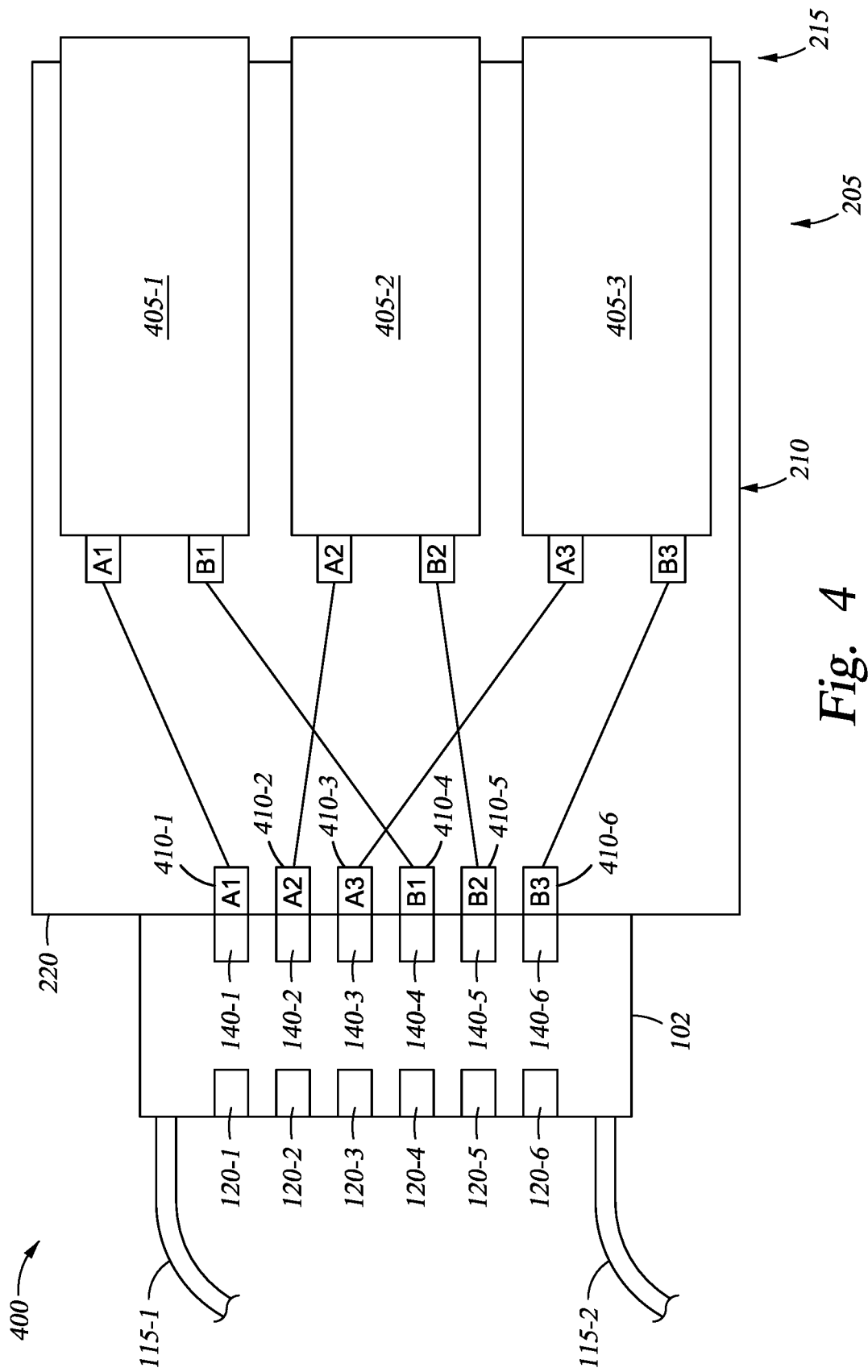
FIG. 4 illustrates connection to multiple power supply units using a modular power distribution unit in a power tray or power shelf, according to one or more embodiments.

FIG. 4 illustrates connection to multiple PSUs 405-1, 405-2, 405-3 using a modular PDU 102. The features illustrated in diagram 400 may be used in conjunction with other embodiments. For example, the modular PDU 102 of FIG. 1 may be connected to the power tray 205 of FIG. 2.

In the diagram 400, the power connectors 140-1, ..., 140-6 of the modular PDU 102 (six in this example) are in a coupled configuration with power connectors 410-1, ..., 410-6 at the rear face 220 of the power tray 205. In some embodiments, the power cable 115-1 carries three-phase power of a first redundant power bus (A), and the power cable 115-2 carries three-phase power of a redundant second power bus (B).

Distribution circuitry within the modular PDU 102 distributes different phases of power to the power connectors 140-1, ..., 140-6. As shown in this example, the modular PDU 102 comprises three (3) PSUs 405-1, 405-2, 405-3 to a power tray or power rack with line redundant dual inputs (e.g., A-bus and B-bus) to each PSU 405-1, 405-2, 405-3. In other embodiments, the power supplied by the power cables 115-1, 115-2 is not redundant and may come from similar non-redundant sources. As shown, the power connector 140-1 receives a first phase A1 of the first power bus, the power connector 140-2 receives a second phase A2 of the first power bus, and the power connector 140-3 receives a third phase A3 of the first power bus. The power connector 140-4 receives a first phase B1 of the second power bus, the power connector 140-5 receives a second phase B2 of the second power bus, and the power connector 140-6 receives a third phase B3 of the second power bus. In some embodiments, the first phases A1, B1 are in phase with each other, the second phases A2, B2 are in phase with each other, and the third phases A3, B3 are in phase with each other. The PSU 405-1 receives the first phases A1, B1, the PSU 405-2 receives the second phases A2, B2, and the PSU 405-3 receives the third phases A3, B3.

In other embodiments, the phase numbers may be different to the redundant or non-redundant inputs of each PSU 405-1, 405-2, 405-3 so that the power provided to each PSU 405-1, 405-2, 405-3 is out-of-phase. In other embodiments, there may only be one input power cable feeding the multiple PSU 405-1, 405-2, 405-3 in a power tray or a power shelf. In other embodiments, the power provided to the PSUs 405-1, 405-2, 405-3 may be one-phase AC inputs or DC inputs.

The example of the modular PDU 102 shows three phases that are numbered 1, 2, and 3 for simplicity. These numbers may represent phases A, B, and C respectively for a typical three-phase wye power source, or may represent phases A-B, B-C, and C-A respectively for a typical three-phase delta power source.

Thus, in one example implementation, the modular PDU 102 receives 30 amp (A) three-phase power on each power bus, and the modular PDU 102 delivers 14.4 kilowatts (kW) to the power tray 205 to provide 4.8 kW (with N+N redundancy) to each of the PSUs 405-1, 405-2, 405-3. The modular PDU 102 may have a compact implementation, e.g., using low-cost connectors and/or the electronic circuit breakers 120-1, ..., 120-6, and may be connected with facility power and with the power tray 205 without requiring unnecessary power cables.

FIG. 18 illustrates multiple rack-mounted power trays coupled with modular power distribution units, according to one or more embodiments. More specifically, FIG. 18 provides a comparison between a conventional example requirement for a new third-party PDU with power strips having Saf-D-Grid connectors plus new power cable development, and a new modular/pluggable PDU into 2 each 3-across power trays with 30A Dual-Input Line-Redundant N+N 1RU AC/HVAC/HVDC power supplies.

More specifically, diagram 1800 illustrates a conventional approach using third-party PDU power strips with Saf-D-

Figure 9:
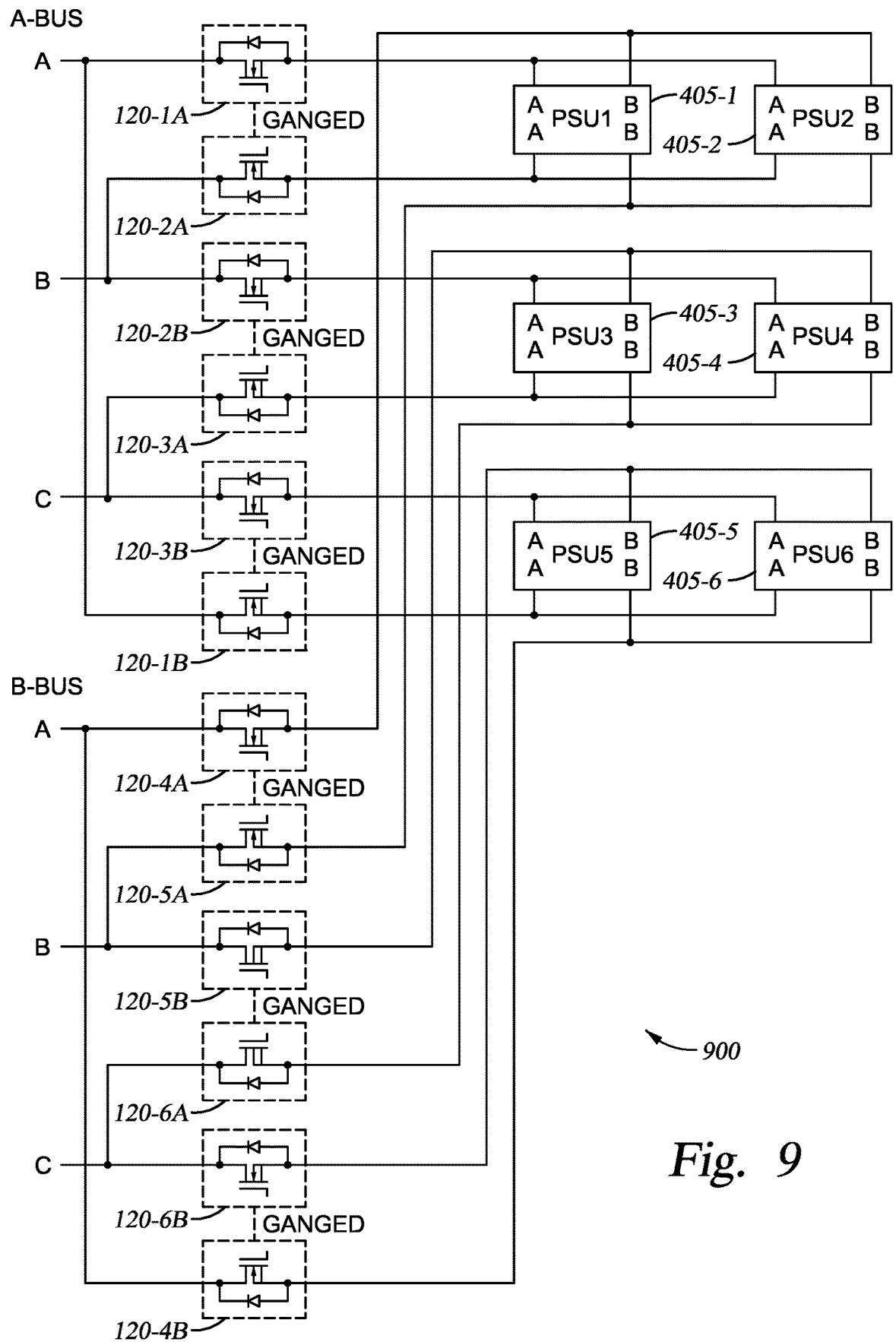
FIG. 9 is a diagram of an exemplary configuration of a modular power distribution unit with single-phase electronic circuit breakers from dual 3-Phase Delta inputs, according to one or more embodiments.

Grid connectors and custom developed power cables. The diagram 1800 includes four (4)×3-plug PDUs with electro-mechanical circuit breakers (not shown) at 18RU 31.5-inch long×3-inches wide×4-inches high PDU power strips each for 208VAC 60A 3-Phase Delta feeds with 12×30A power cables with wasted cable power loss to the power trays/shelves. In contrast, diagram 1810 includes two (2) pluggable 1RU PDUs according to embodiments described herein, that are 10.5-inches long×1.6" high×~12-inches deep, and provide 208VAC 60A 3-Phase Delta dual feed into the power trays. The two pluggable PDUs each have three (3) two-pole electro-mechanical circuit breakers (e.g., as shown in FIG. 9) Beneficially, the pluggable PDUs require less rack space, eliminate twelve (12) power cords for simpler cable management, cause less interference with system air flow, allow easier system rear access, lower cable power loss for a higher system power efficiency, and lowers system cost.

Figure 5:
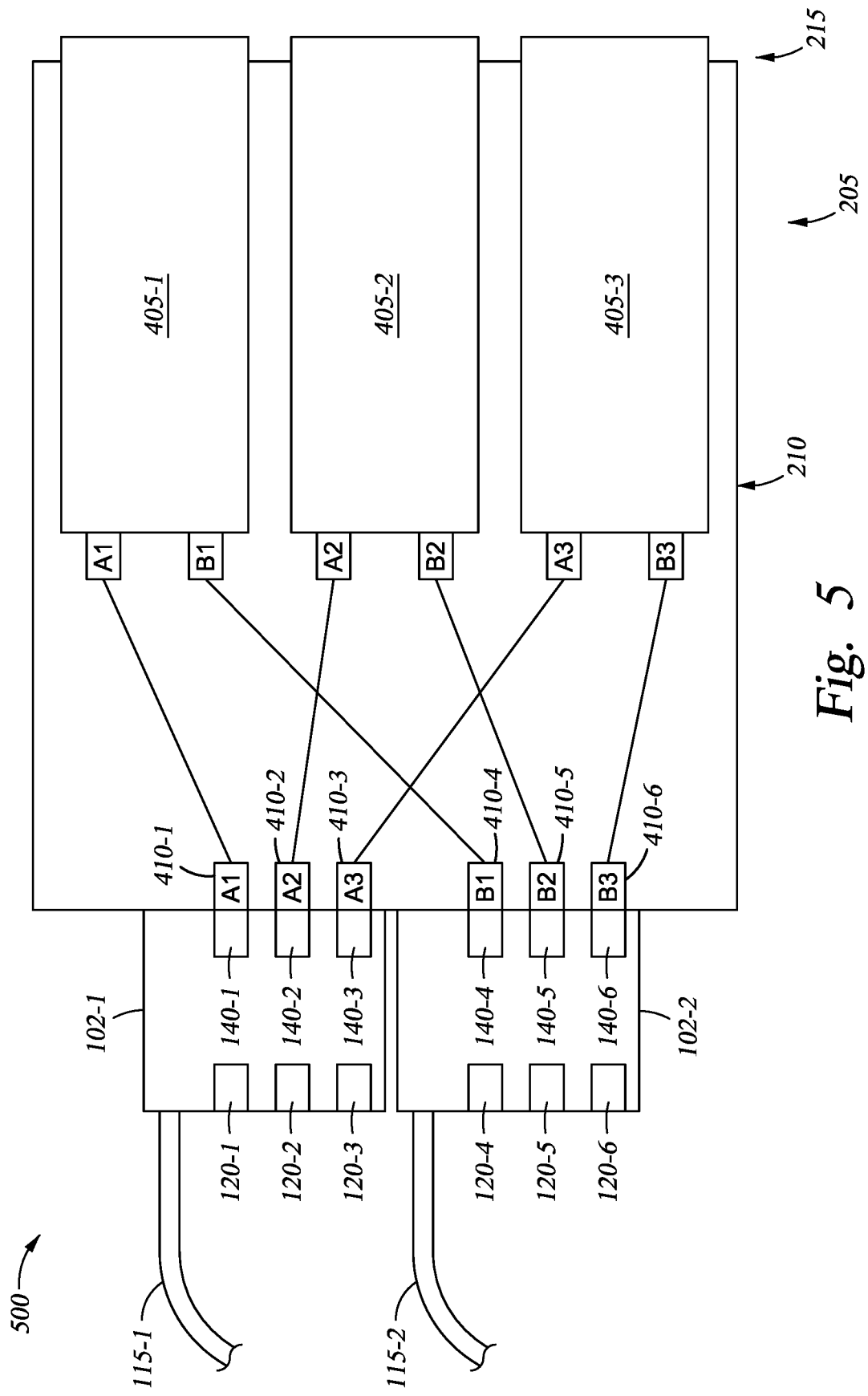
FIG. 5 illustrates connection to multiple power supply units using multiple modular power distribution units in a power tray or power shelf, according to one or more embodiments.

FIG. 5 illustrates connection to the multiple PSUs 405-1, 405-2, 405-3 using multiple modular PDUs 102-1, 102-2. The features illustrated in diagram 500 may be used in conjunction with other embodiments. For example, each of the modular PDUs 102-1, 102-2 represents an example of the modular PDU 102 of FIG. 1.

In the diagram 500, the power connectors 140-1, 140-2, 140-3 of the modular PDU 102-1 are aligned with (in a non-coupled configuration) the power connectors 410-1, 410-2, 410-3 at the rear face 220 of the power tray 205, and the power connectors 140-4, 140-5, 140-6 of the modular PDU 102-2 are aligned with (in a non-coupled configuration) the power connectors 410-4, 410-5, 410-6. Although not shown, each of the modular PDUs 102-1, 102-2 may include one or more fasteners to attach the modular PDUs 102-1, 102-2 to the rear face 220 of the power tray 205.

Figure 6:
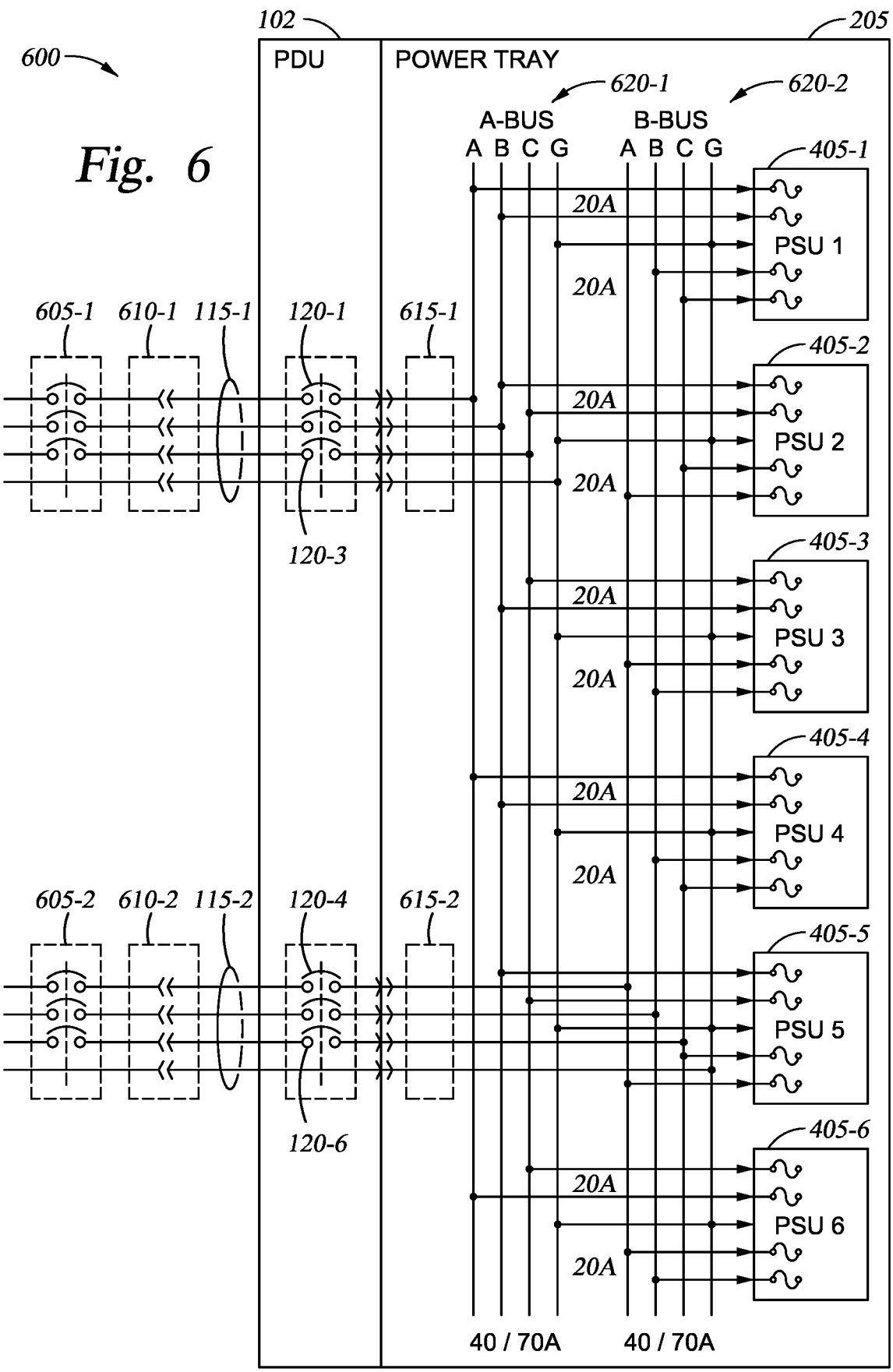
FIG. 6 is a diagram of an exemplary configuration of a modular power distribution unit coupled with a power tray to multiple power units, according to one or more embodiments.

FIG. 6 is a diagram 600 of an exemplary configuration of a modular PDU coupled with a power tray. The features illustrated in the diagram 600 may be used in conjunction with other embodiments. For example, the diagram 600 illustrates one possible implementation of the modular PDU 102 and the power tray 205.

In the diagram 600, the power tray 205 comprises six (6) PSUs 405-1, . . . , 405-6 with line-redundant dual inputs. For a first power bus, the three-phase facility power is provided onto the power cable 115-1 though facility circuit breakers 605-1 and a power connector 610-1, and for a second power bus, the three-phase facility power is provided onto the power cable 115-2 through facility circuit breakers 605-2 and a power connector 610-2.

The power cable 115-1 delivers three-phase power to the power tray 205 through the electronic circuit breakers 120-1, 120-2, 120-3, and the power cable 115-2 delivers three-phase power to the power tray 205 through the electronic circuit breakers 120-4, 120-5, 120-6. In some embodiments, corresponding power connectors of the modular PDU 102 and the power tray 205 are in a coupled configuration. As shown in this example, the phases of power are distributed to the PSUs 405-1, . . . , 405-6 at the power tray 205.

In some embodiments of the modular PDU, a first set of busbars 620-1 connects phases of power (and ground) from the power cable 115-1, and a second set of busbars 620-2 connects phases of power (and ground) from the power cable 115-2, to various ones of the PSUs 405-1, . . . , 405-6. In some embodiments of the power tray or the power shelf, filtering circuity 615-1, 615-2 is arranged between the respective power cables 115-1, 115-2 and the respective sets of busbars 620-1, 620-2 to provide electromagnetic interference (EMI) filtering of the phases of power.

As shown, the first set of busbars 620-1 is the A-Bus redundant feed and provides a first phase (A) of the first power bus to PSUs 405-1, 405-3, 405-4, 405-6, a second phase (B) of the first power bus to PSUs 405-1, 405-2, 405-4, 405-5, and a third phase (C) of the first power bus to PSUs 405-2, 405-3, 405-5, 405-6. A ground (G) is connected with each of the PSUs 405-1, . . . , 405-6.

The second set of busbars 620-2 is the B-Bus redundant feed and provides a first phase (A) of the second power bus to PSUs 405-2, 405-3, 405-5, 405-6, a second phase (B) of the second power bus to PSUs 405-1, 405-3, 405-4, 405-6, and a third phase (C) of the second power bus to PSUs 405-1, 405-2, 405-4, 405-5. A ground (G) is connected with each of the PSUs 405-1, . . . , 405-6. Note that the A-Bus and the B-bus redundant feeds to each PSU are from different phases to be 120 degrees apart to reduce ripple.

Thus, in one example implementation, the modular PDU 102 receives three-phase power (delta configuration) at 208 volts alternating current (VAC) and 70 A. While electro-mechanical circuit breakers are shown, electronic circuit breakers may be used alternately to provide a smaller size. For each power bus, the electronic circuit breakers 120-1, . . . , 120-6 include electronic ganging control, which supports a compact implementation of the PDU 102 despite the relatively high rating (70 A) for the electronic circuit breakers 120-1, . . . , 120-6.

Figure 7:
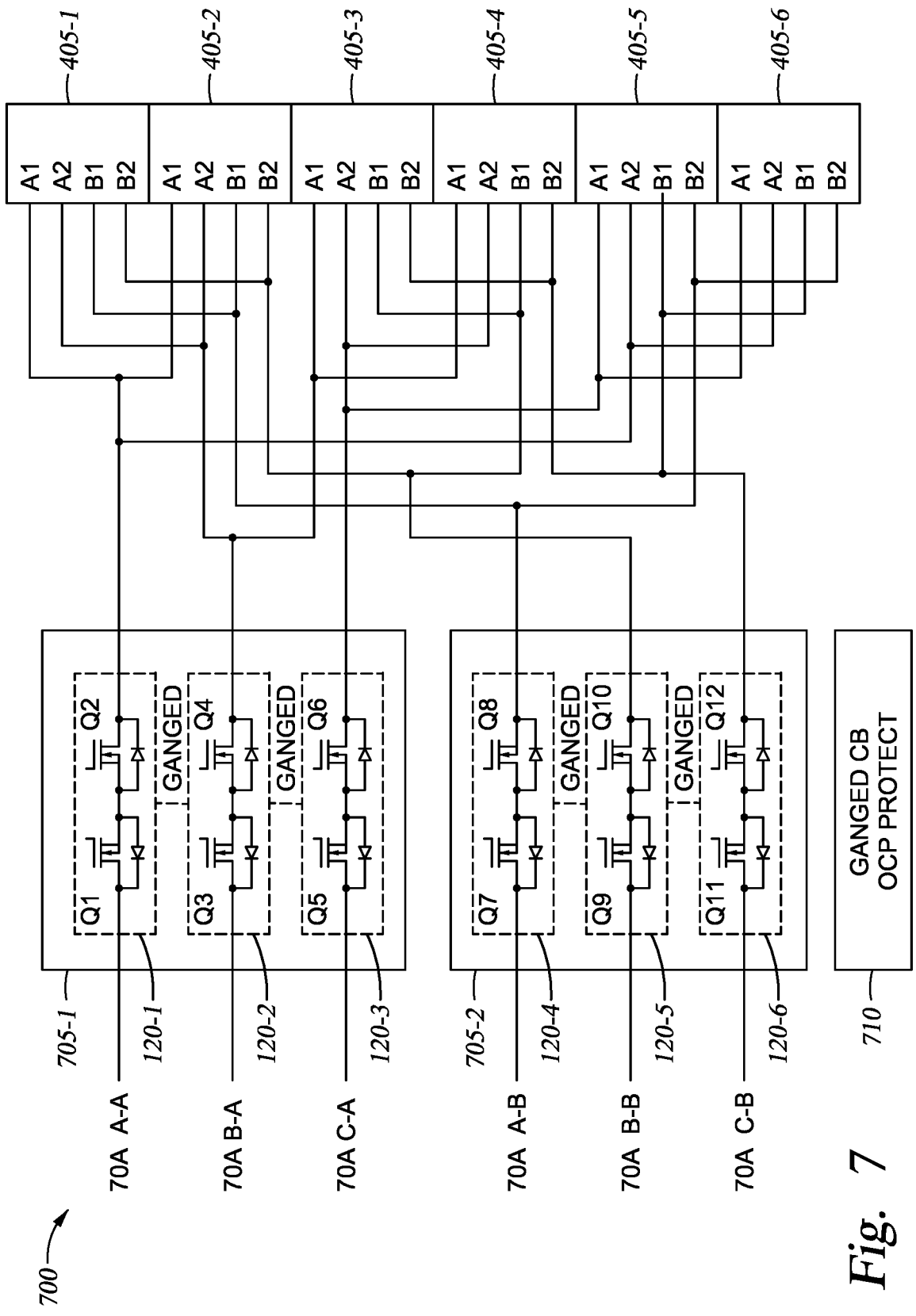
FIG. 7 is a diagram of an exemplary configuration of a modular power distribution unit with dual three-phase Delta, three-pole electronic circuit breakers, according to one or more embodiments.

FIG. 7 is a diagram 700 of an exemplary configuration of a modular PDU with redundant A/B-Bus three-phase Delta inputs, three pole electronic circuit breakers 705-1, 705-2 on each 3-Phase bus that output to redundant inputs of 6 PSUs 405-1 with inputs connected in pairs in this example. The features illustrated in the diagram 700 may be used in conjunction with other embodiments. For example, the electronic circuit breakers 705-1, 705-2 may be represented as in FIG. 6 and may be implemented in the modular PDU 102 shown in any of FIGS. 1A, 1B, 2, 3, 4, 5, and 6.

In the diagram 700, the modular PDU comprises three-phase, three-pole electronic circuit breakers 705-1, 705-2 for each power bus. The electronic circuit breaker 705-1 comprises one pole of the electronic circuit breaker examples of 120-1, 120-2, 120-3 poles for the first power bus, and the electronic circuit breaker 705-2 comprises the electronic circuit breakers 120-4, 120-5, 120-6 poles. As shown, each of the electronic circuit breakers 120-1, 120-2, . . . , 120-6 comprises a pair of back-to-back MOSFET switches {Q1, Q2} providing AC isolation when in the non-conducting state and low resistance coupling when in the conducting state, {Q3, Q4}, . . . {Q11, Q12} for the respective phase. The MOSFET switches Q1, Q2, . . . , Q12 provide AC isolation when in the non-conducting state and a low resistance coupling when in the conducting state. As shown, the back-to-back MOSFET switches {Q1, Q2}, {Q3, Q4}, . . . {Q11, Q12} of each pair are arranged in a common-source configuration for typical common gate voltage source and drive control. Although MOSFET switches Q1, Q2, . . . , Q12 are shown, other types of transistors are also contemplated, such as silicon carbide (SiC) transistors and gallium nitride (GaN) transistors.

The MOSFET switches Q1, . . . , Q6 of the first power bus are electronically ganged together, and the MOSFET switches Q7, . . . , Q12 of the second power bus are electronically ganged together. In some embodiments, the electronic circuit breakers 120-1, 120-2, . . . 120-6 include overcurrent protection circuitry 710. For example, the overcurrent protection circuitry may provide inrush protection and/or mating power-off interlock. In some embodiments, the electronic circuit breakers 120-1, 120-2, . . . 120-6 may further include ground fault protection.

Figure 8:
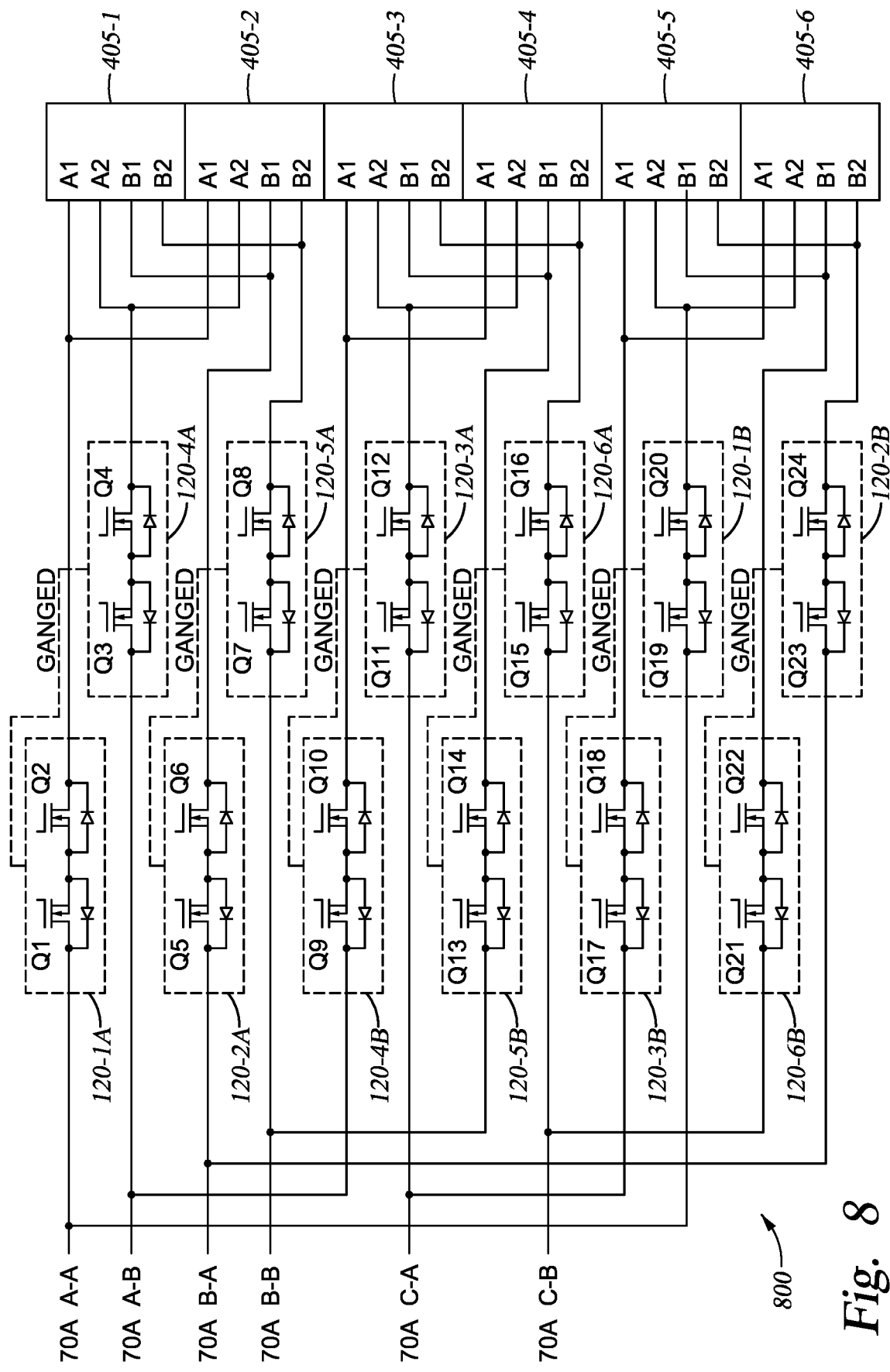
FIG. 8 is a diagram of an exemplary configuration of a modular power distribution unit with single-phase electronic circuit breakers from dual 3-Phase Delta inputs, according to one or more embodiments.

FIG. 8 is a diagram 800 of an exemplary configuration of a modular PDU with a redundant A-Bus and B-bus three-phase Delta inputs to six (6) two-pole single-phase electronic circuit breakers from a Phase-to-Phase or Line-to-Line 3-Phase Delta source with back-to-back MOSFETs on both sides of each line for full AC isolation on both sides of the line that output to redundant inputs of 6 PSUs with inputs connected in pairs in this example. The features illustrated in the diagram 800 may be used in conjunction with other embodiments. For example, the electronic circuit breakers may be implemented in the modular PDU 102 shown in any of FIGS. 1A, 1B, 2, 3, 4, 5, and 6.

In the diagram 800, two (2) three-phase Delta power buses are connected to the modular PDU that output to redundant inputs of 6 PSUs 405 with inputs connected in pairs in this example. The modular PDU comprises, for each phase, a pair of parallel electronic circuit breakers {120-1A, 120-1B}, . . . , {120-6A, 120-6B}.

As shown, a first phase of a first power bus (A-A) includes the electronic circuit breakers 120-1A, 120-1B, a second phase of the first power bus (B-A) includes the electronic circuit breakers 120-2A, 120-2B, and a third phase of the first power bus (C-A) includes the electronic circuit breakers 120-3A, 120-3B. A first phase of a second power bus (A-B) includes the electronic circuit breakers 120-4A, 120-4B, a second phase of the second power bus (B-B) includes the electronic circuit breakers 120-5A, 120-5B, and a third phase of the second power bus (C-B) includes the electronic circuit breakers 120-6A, 120-6B.

The electronic circuit breaker 120-1A comprises back-to-back MOSFET switches Q1, Q2, the electronic circuit breaker 120-1B comprises back-to-back MOSFET switches Q19, Q20, the electronic circuit breaker 120-2A comprises back-to-back MOSFET switches Q5, Q6, the electronic circuit breaker 120-2B comprises back-to-back MOSFET switches Q23, Q24, the electronic circuit breaker 120-3A comprises back-to-back MOSFET switches Q11, Q12, and the electronic circuit breaker 120-3B comprises back-to-back MOSFET switches Q17, Q18.

The electronic circuit breaker 120-4A comprises back-to-back MOSFET switches Q3, Q4, the electronic circuit breaker 120-4B comprises back-to-back MOSFET switches Q9, Q10, the electronic circuit breaker 120-5A comprises back-to-back MOSFET switches Q7, Q8, the electronic circuit breaker 120-5B comprises back-to-back MOSFET switches Q13, Q14, the electronic circuit breaker 120-6A comprises back-to-back MOSFET switches Q15, Q16, and the electronic circuit breaker 120-6B comprises back-to-back MOSFET switches Q21, Q22.

The MOSFETs of the electronic circuit breakers 120-1A, 120-4A are electronically ganged together, the MOSFETs of the electronic circuit breakers 120-2A, 120-5A are electronically ganged together, the MOSFETs of the electronic circuit breakers 120-3A, 120-4B are electronically ganged together, the MOSFETs of the electronic circuit breakers 120-6A, 120-5B are electronically ganged together, the MOSFETs of the electronic circuit breakers 120-3B, 120-1B are electronically ganged together, and the MOSFETs of the electronic circuit breakers 120-6B, 120-2B are electronically ganged together.

FIG. 9 is a diagram 900 of an exemplary configuration of a modular PDU with two (2) redundant three-phase inputs to six (6) two-pole single-phase electronic circuit breakers. The features illustrated in the diagram 900 may be used in conjunction with other embodiments. For example, the diagram 900 may represent one possible implementation of the modular PDU 102 shown in any of FIGS. 1A, 1B, 2, 3, 4, 5, 6, 7, and 8.

In the diagram 900, two (2) three-phase redundant input NB power buses are connected to the modular PDU. The modular PDU comprises, for each PSU input is phase-to-phase from a two-pole electronic circuit breaker with a pair of back-to-back MOSFETs for line-to-line AC isolation on each 3-phase input of the six (6) electronic circuit breakers {120-1A, 120-1B}, . . . , {120-6A, 120-6B} poles.

Each PSU in the diagram 900 has dual-input line-redundancy from both the A-Bus and the B-Bus from 3-Phase Delta sources through the modular PDU to 6 PDUs redundant-input connected in pairs. As shown, each input is from a line-to-line or phase-to-phase input that may be called a single-phase input from a 2-Pole electronic circuit breaker for line-to-line AC isolation. In this case, each pole of the electronic circuit breaker is represented by a respective MOSFET, and pairs of MOSFETs are back-to-back with each other with one on each phase line for switched-Off isolation, as compared to FIG. 8 where each pole includes with 2 back-to-back MOSFET switches. This embodiment requires fewer MOSFETs than the implementation of FIG. 8 with less complexity, less cost, and comparable reliability and safety.

The A-Bus 3-Phase input example provides 3 electronic circuit breakers to the A-Bus inputs of 6 PSUs, with 2 PSU inputs on each electronic circuit breaker. MOSFETs of the electronic circuit breakers 120-1A and 120-2A are electronically ganged together for On/Off control and overcurrent protection for 1-Phase input from Phases A/B. Likewise MOSFETs of the electronic circuit breakers 120-2B and 120-3A are electronically ganged together for On/Off control and overcurrent protection for 1-Phase input from Phases B/C. Likewise MOSFETs of the electronic circuit breakers 120-3B and 120-1B are electronically ganged together for On/Off control and overcurrent protection for 1-Phase input from Phases C/A.

The B-Bus 3-Phase input example provides 3 electronic circuit breakers to the B-Bus inputs of 6 PSUs, with 2 PSU inputs on each electronic circuit breaker. MOSFETs of the electronic circuit breakers 120-4A and 120-5A are electronically ganged together for On/Off control and overcurrent protection for 1-Phase input from Phases A/B. Likewise MOSFETs of the electronic circuit breakers 120-5B and 120-6A are electronically ganged together for On/Off control and overcurrent protection for 1-Phase input from Phases B/C. Likewise MOSFETs of the electronic circuit breakers 120-6B and 120-4B are electronically ganged together for On/Off control and overcurrent protection for 1-Phase input from Phases C/A.

In some embodiments, the modular PDU may include series inductors (not shown) that provide additional inrush protection with bidirectional transient protection. The configuration shown in diagram 900 may be used for any 2-pole electronic circuit breaker for AC isolation and for DC isolation with any polarity.

Figure 10:
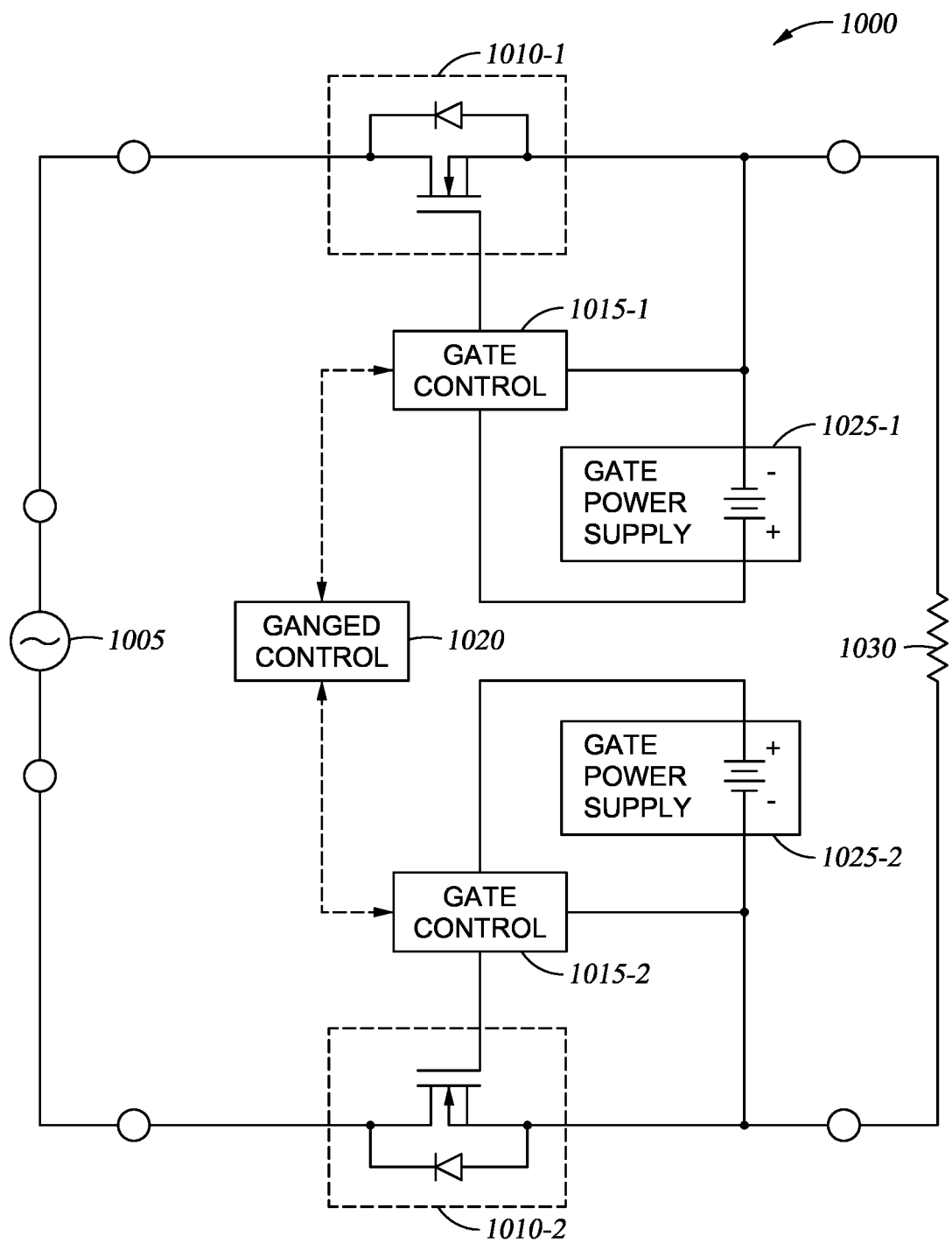
FIG. 10 is a diagram of an exemplary single-phase electronic circuit breaker control, according to one or more embodiments.

FIG. 10 is a diagram 1000 of an exemplary single-phase electronic circuit breaker, according to one or more embodiments. The features illustrated in the diagram 1000 may be used in conjunction with other embodiments. For example, the electronic circuit breaker is related to FIG. 9 and may be implemented in the modular PDU 102 shown in any of FIGS. 1A, 1B, 2, 3, 4, 5, 6, 7, and 8.

The electronic circuit breaker comprises a power source 1005, which may be an AC power source or a DC power source of any polarity. One terminal of the power source 1005 is connected to the drain terminal of a first MOSFET switch 1010-1, and another terminal of the power source 1005 is connected to the drain terminal of a second MOSFET switch 1010-2. The electronic circuit breaker further comprises gate control circuitry 1015-1 connected to the gate of the first MOSFET switch 1010-1, and gate control circuitry 1015-2 connected to the gate of the second MOSFET switch 1010-2.

The gate control circuitry 1015-1 receives power from a gate power supply 1025-1, and the gate control circuitry 1015-2 receives power from a gate power supply 1025-2. The gate control circuitry 1015-1 and the gate control circuitry 1015-2 are electronically ganged through ganged control circuitry 1020.

The first MOSFET switch 1010-1 is connected to a source terminal of an output load 1030, and a source terminal of the second MOSFET switch 1010-2 is connected to a second terminal of the output load 1030. In some embodiments, the gate power supply 1025-1 is coupled to the first terminal of the output load 1030, and the gate power supply 1025-2 is coupled to the second terminal of the output load 1030. Beneficially, this configuration of the electronic circuit breaker may be implemented with fewer MOSFETs.

Figure 11:
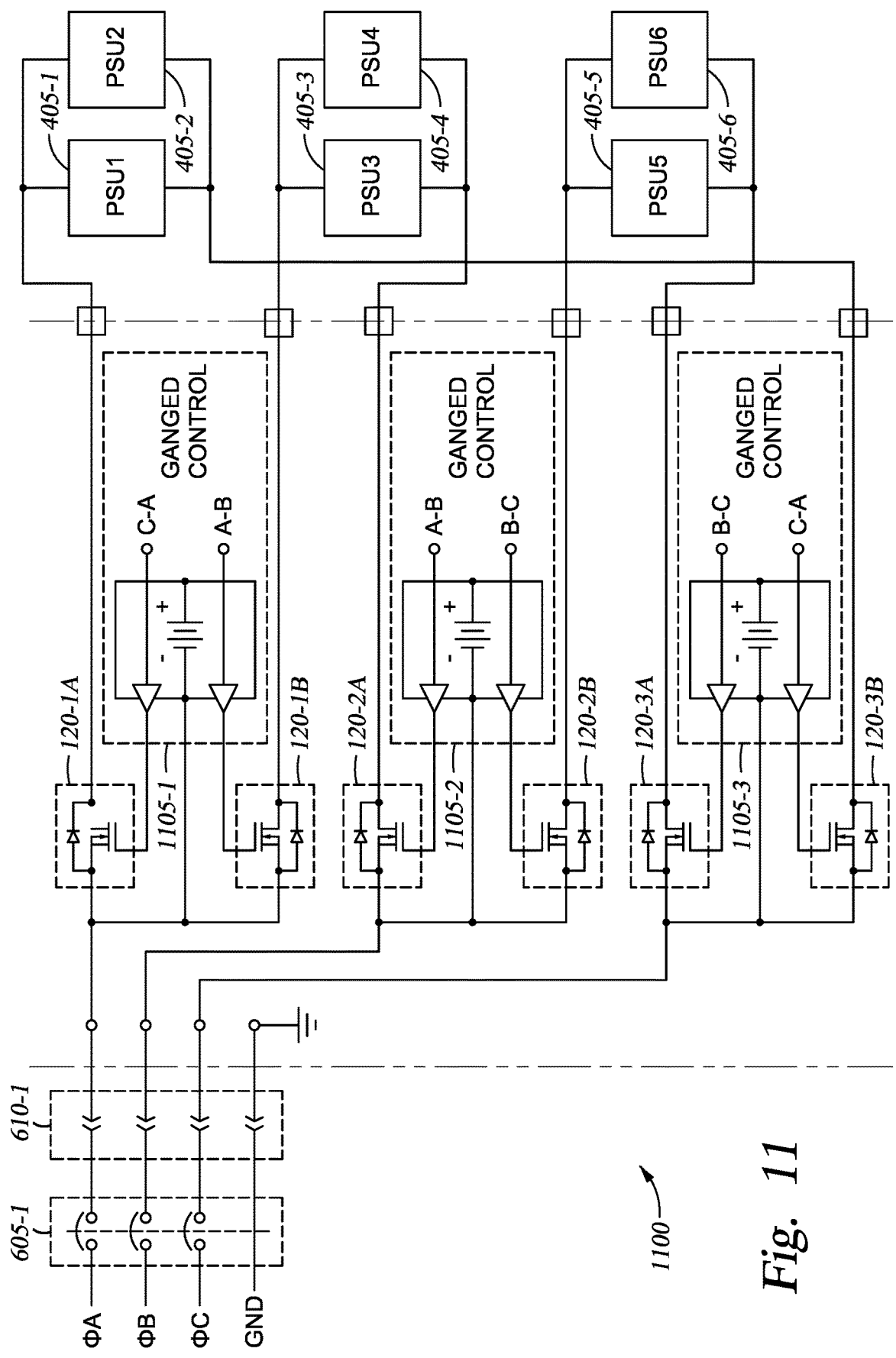
FIG. 11 is a diagram of an exemplary configuration of a modular power distribution unit with three single-phase electronic circuit breakers, according to one or more embodiments.

FIG. 11 is a diagram 1100 of an exemplary configuration of a modular PDU with a 3-Phase Delta input to three (3) 2-Pole single-phase electronic circuit breakers to inputs of 6 PSUs connected in pairs. The features illustrated in the diagram 1100 may be used in conjunction with other embodiments. For example, the diagram 1100 illustrates one possible implementation of the modular PDU 102 and the power tray 205.

In the diagram 1100, the three-phase facility power is provided onto the power cable 115-1 though facility circuit breakers 605-1 and a power connector 610-1. Although one power bus is shown for clarity, implementations of the modular PDU may include additional circuitry to connect with one or more additional power buses.

In this example, only a single phase inputs are shown to the pairs of 6 PSUs 405-1, 405-2, . . . 405-6. Each input is rated for 20A with 2 PSU inputs connected to each 40A electronic circuit breaker MOSFET 2-pole pairs. The facility power is from a 208VAC 3-Phase Delta with circuit breaker 605-1 rated for 70A for the 3 single-phase 40A load currents divided by the square root of 3. Facility power connector 610-1 is a typical 100A rating unless a compliant connector nearer 70A can be used.

The implementation shown in the diagram 1100 may be considered a variation of FIG. 9 wherein the redundant inputs to each PSU from the A-Bus and the B-Bus are from different phase pairs so as to always be 120 degrees apart. This variation allows lower rectified ripple voltages of the shared output power waveforms typically from the power factor correction input sections. This variation also improves the ride-through time or the hold-up time of the output power with input power dropout from both inputs together, due to the overlap of the 2 inputs for the zero-crossing low-power portions of the input AC rectified waveforms.

The implementation shown in the diagram 1100 also provides a simplified and lower cost method of connecting the MOSFET pairs to the 3-Phase input lines allowing only 3 isolated MOSFET gate voltage power supplies, control drivers, and sensing circuits where 6 were used in FIG. 9. In this case only MOSFET sources may be common to each phase line for different poles of different electronic circuit breakers. Electronic circuit breaker pairs are isolated from each other and will require isolated gate control between circuit breaker MOSFET poles as in FIG. 9.

The modular PDU comprises, for each phase, a pair of MOSFETs of the electronic circuit breakers {120-1A, 120-1B}, . . . , {120-3A, 120-3B} as respective poles of the 2-pole electronic circuit breakers. As shown, a first phase of the power bus (A) includes the MOSFETs of the electronic circuit breakers 120-1A, 120-1B, a second phase of the power bus (B) includes the MOSFETs of the electronic circuit breakers 120-2A, 120-2B, and a third phase of the power bus (C) includes the MOSFETs of the electronic circuit breakers 120-3A, 120-3B.

Each of these MOSFET pairs on a particular phase share a common gate power supply with different gate drivers that are electronically ganged to make up the 3 sets of 2-Pole 40A electronic circuit breakers, such as the electronic circuit breakers 120-1A and 120-3B for phases A-C, the electronic circuit breakers 120-1B and 120-2A for phases A-B, and the electronic circuit breakers 120-2B and 120-3A for phases B-C.

In this configuration of the modular PDU, the electronic circuit breakers 120-1A, 120-1B, . . . , 120-6B may be implemented with fewer MOSFETs with less complexity and cost than the implementation shown in FIG. 8 (here, fewer back-to-back MOSFETs) with, at most, a negligible increase in risk to reliability or safety.

In some embodiments, the modular PDU may include series inductors (not shown) that provide additional inrush protection with bidirectional transient protection.

Figure 12:
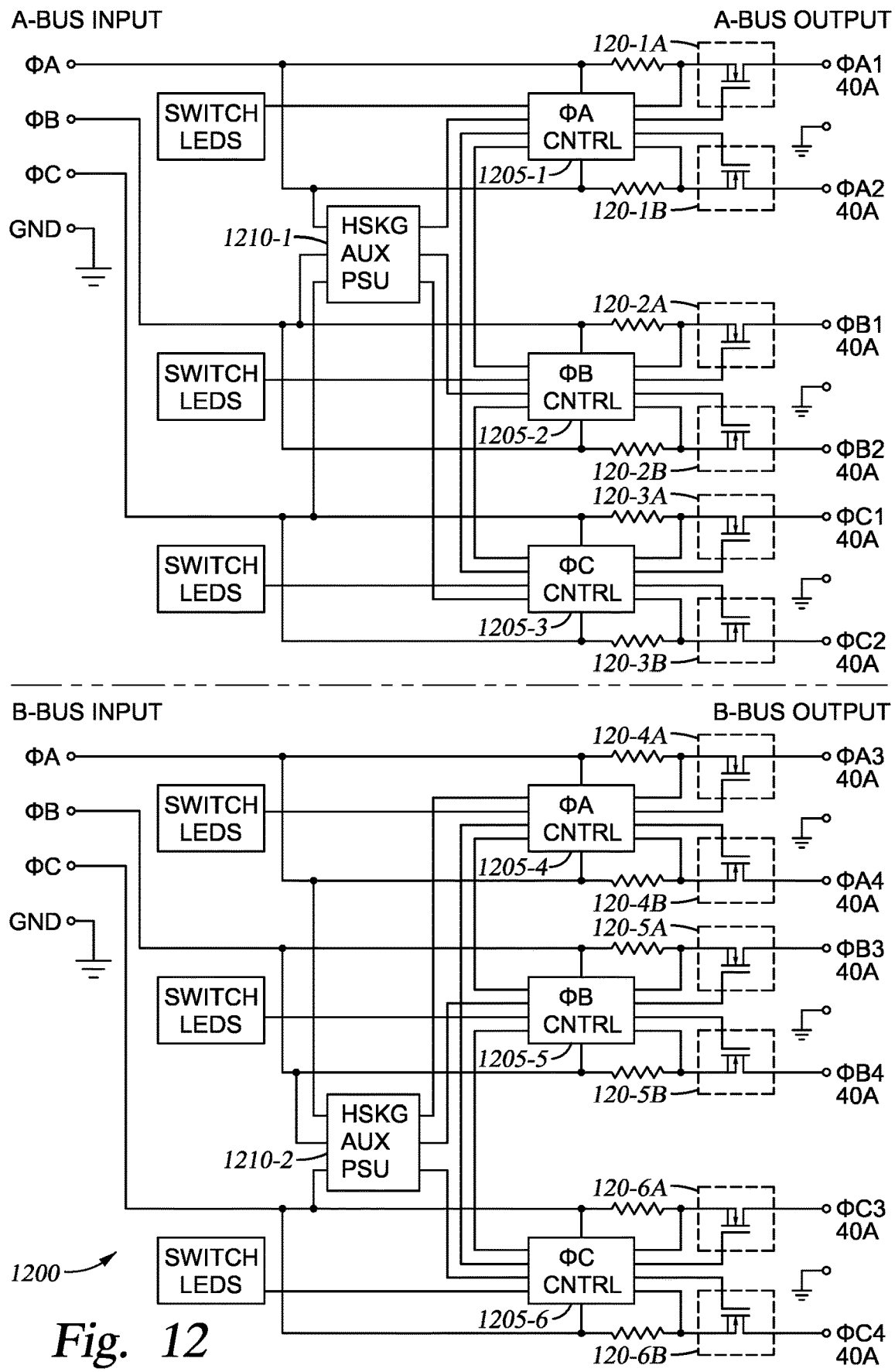
FIG. 12 is a diagram of an exemplary configuration of a modular power distribution unit with control circuit of single-phase electronic circuit breakers from 3-Phase Delta inputs, according to one or more embodiments.

FIG. 12 is a diagram 1200 of an exemplary configuration of a modular PDU with two (2) redundant 3-Phase inputs to six (6) 2-Pole single-phase electronic circuit breakers. This is a block diagram of the control power and control circuits for the 2-Pole electronic circuit breakers as represented in FIG. 11. For example, the diagram 1200 may represent one possible implementation of the modular PDU 102 shown in any of FIGS. 1A, 1B, 2, 3, 4, 5, 6, 7, 8, and 11.

In the diagram 1200, two (2) three-phase power buses are connected to the modular PDU. The modular PDU comprises, for each phase, a pair of parallel MOSFET switches {120-1A, 120-1B}, . . . , {120-6A, 120-6B} for each phase that are individually controlled by 1205-1, 1205-2, . . . 1205-6 and ganged for 2-Pole 1-Phase electronic circuit breaker outputs to the output connectors that are connected to the power tray or power shelf.

Each of the electronic circuit breakers comprises a respective set of two (2) MOSFET switches. The #1 electronic circuit breaker poles are MOSFETs of the electronic circuit breakers 120-1B and 120-2A controlled by drive circuits 1205-1 and 1205-2, the #2 electronic circuit breaker poles are MOSFETs of the electronic circuit breakers 120-2B and 120-3A controlled by drive circuits 1205-2 and 1205-3, the #3 electronic circuit breaker poles are MOSFETs of the electronic circuit breakers 120-3B and 120-1A controlled by drive circuits 1205-3 and 1205-1, the #4 electronic circuit breaker poles are MOSFETs of the electronic circuit breakers 120-4B and 120-5A controlled by drive circuits 1205-4 and 1205-5, the #5 electronic circuit breaker poles are MOSFETs of the electronic circuit breakers 120-5B and 120-6A controlled by drive circuits 1205-5 and 1205-6, the #6 electronic circuit breaker poles are MOSFETs of the electronic circuit breakers 120-6B and 120-4A controlled by drive circuits 1205-6 and 1205-4.

Each phase is provided in parallel branches as inputs to the respective drive circuitry 1205-1, . . . , 1205-6. Each phase is also provided from the respective drive circuitry 1205-1, . . . , 1205-6 as outputs to the respective electronic circuit breaker MOSFETs of the electronic circuit breakers 120-1A, . . . , 120-6B. In some embodiments, the input of the phase and the output of the phase are also connected through a resistor for current sensing to the respective drive control circuitry 1205-1, . . . , 1205-6. In some embodiments, the input of the phase and the output of the phase are also connected through a resistor for over current sensing and control for overcurrent protection to the respective drive control circuitry 1205-1, . . . , 1205-6. The output of the phases may be provided through the electronic circuit breakers to one or more PSUs, as is described elsewhere in this application.

Each of the drive circuitry 1205-1, . . . , 1205-6 of a power bus may be interconnected to provide electronically ganged control of the respective electronic circuit breaker MOSFETs of the electronic circuit breakers 120-1A, . . . , 120-6B. In some embodiments, each of the drive circuitry 1205-1, . . . , 1205-6 is connected with respective switches and indicators (such as LEDs) to indicate an operational state of the respective electronic circuit breakers 120-1A, . . . , 120-6B.

In some cases, each of the drive circuitry 1205-1, . . . , 1205-6 of a power bus is connected with an auxiliary PSU 1210-1, 1210-2. The auxiliary PSU 1210-2 is connected with one branch of each of the phases of the first power bus. The auxiliary PSU 1210-2 is connected with one branch of each of the phases of the second power bus.

Thus, in one example implementation, the modular PDU receives dual (N+N) three-phase power (delta configuration) at 208 VAC and 70 A. The modular PDU provides six (6) 40 A power outputs via the electronic circuit breakers 120-1A, . . . , 120-6B. In some embodiments, each of the 40 A power outputs is provided as two (2) 20 A PSU inputs in the power tray, with electronically ganged back-back pairs of MOSFET AC switches.

In another example implementation, three-phase power (delta configuration) is provided at 208VAC and 60 A, and the modular PDU provides twelve (12) single phase 30A outputs into each N+N input for 3-across PSUs. In another example implementation, three-phase power (delta configuration) is provided at 208VAC and 100 A, and the modular PDU provides twelve (12) single phase 30A outputs into each N+N input for 3-across PSUs.

Figure 13:
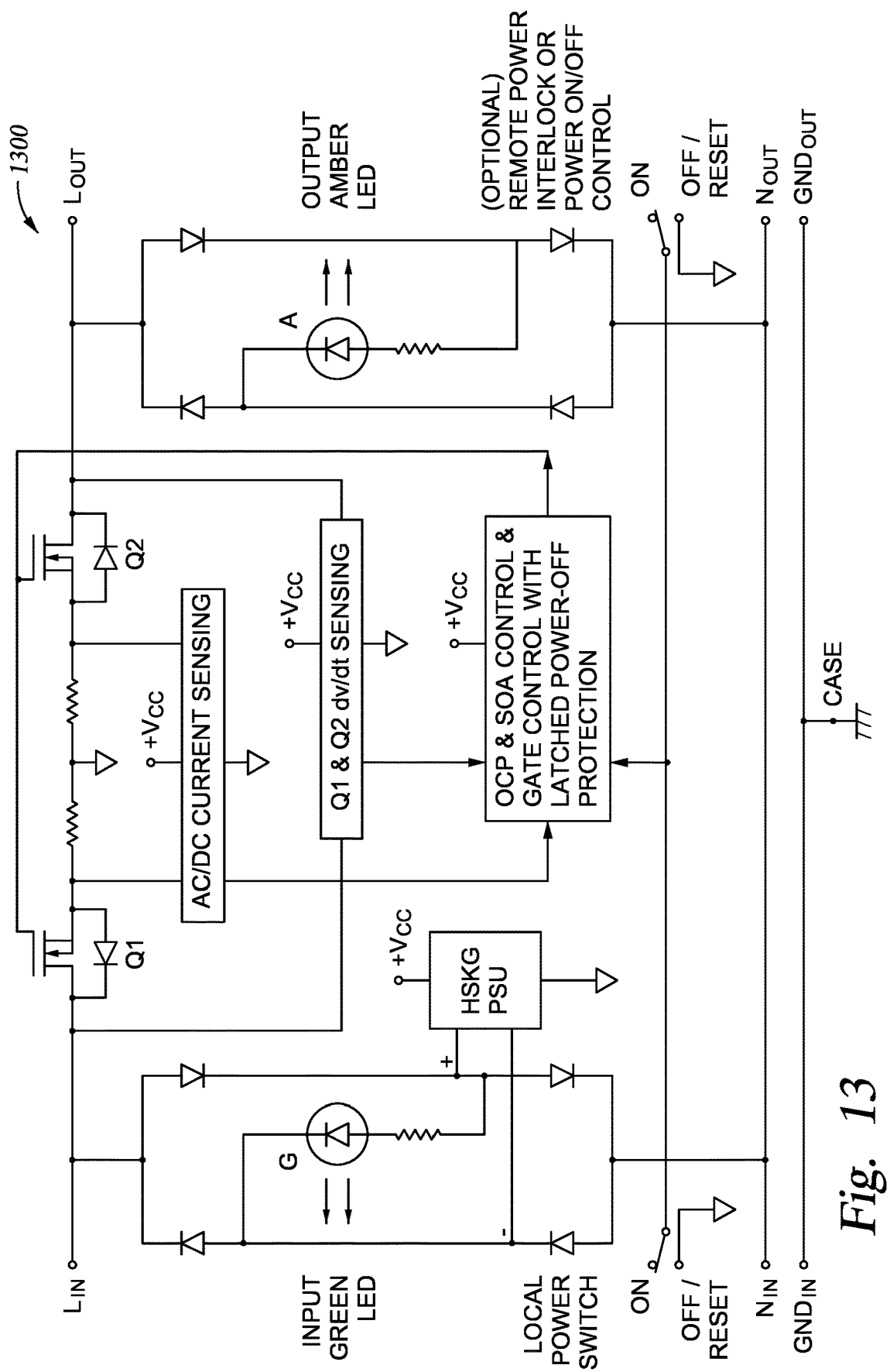
FIG. 13 is a diagram of an exemplary single-phase electronic circuit breaker control circuit from AC Wye input, according to one or more embodiments.

FIG. 13 is a diagram 1300 of an exemplary 1-Pole single-phase electronic circuit breaker, according to one or more embodiments. The features illustrated in the diagram 1300 may be used in conjunction with other embodiments. For example, the electronic circuit breaker may be similarly represented with slight changes in a 3-Phase 3-Pole overcurrent sense circuit as in FIG. 13 and implemented in the modular PDU 102 shown in any of FIGS. 1A, 1B, 2, 3, 4, 5, 6, 7, and 8. Further, FIGS. 19A-19D are a circuit diagram representing an example implementation of the electronic circuit breaker of the diagram 1300.

The diagram 1300 represents an example of back-to-back MOSFETs for AC isolation of a single-phase such as from a 3-Phase Wye single-line with an overcurrent protection circuit. An AC/DC housekeeping PSU from the AC input full-bridge rectifier provides the isolated +Vcc for the MOSFET gate voltage and control voltages to the control circuits. In some embodiments, a current sensing circuit provides a input to an overcurrent control circuit and gate control circuit for On/Off power control and overcurrent fault trip and latch. In some embodiments, two (2) identical control circuits for the two (2) MOSFETs that each sense overcurrent during one half of the AC line frequency. The overcurrent sensing circuit tries to simulate the approximate current/time trip curve of a representative electro-mechanical circuit breaker. This may be done with a fast-high-overcurrent trip level, plus one or more slower-lower-overcurrent level(s), allowing programmed trip delays and current-time curves. An optional dv/dt sensing circuit may be added for MOSFET SOA protection circuit to limit the Q1 and Q2 MOSFET peak power stress with voltage versus time and versus current to stay in the safe region. This protection may include adjusting a current limiting control like a soft start and/or current/voltage-versus-time trip control. When an overcurrent level is exceeded, a latch-Off of the gate voltage is maintained until reset with an AC power loss or from an internal Power-Off-Reset and/or an optional from external interlock switch. The external interlock switch needs to be energized and the power-On switch needs to be set to allow power to be started or to restart after a latch-Off fault. Optional AC/DC Voltage-IN and Voltage-Out LED indicators are also provided to display the electronic circuit breaker condition and for power safety. Case ground is provided through the PDU from the input AC line ground wire and to the output overcurrent protected wiring.

Figure 14A:
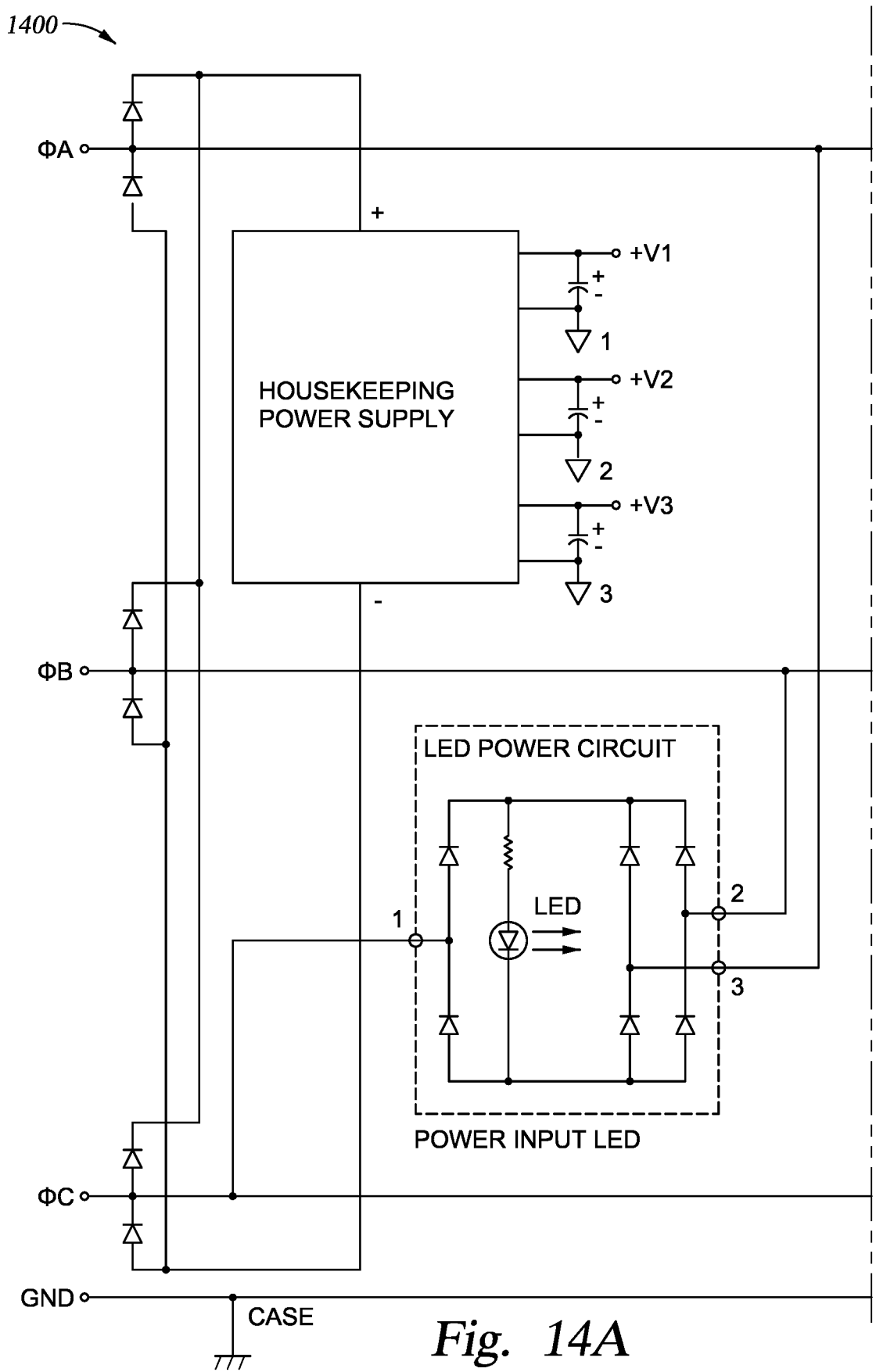
FIGS. 14A, 14B is a diagram of an exemplary three-phase, three pole electronic circuit breaker control circuit, according to one or more embodiments.
Figure 14B:
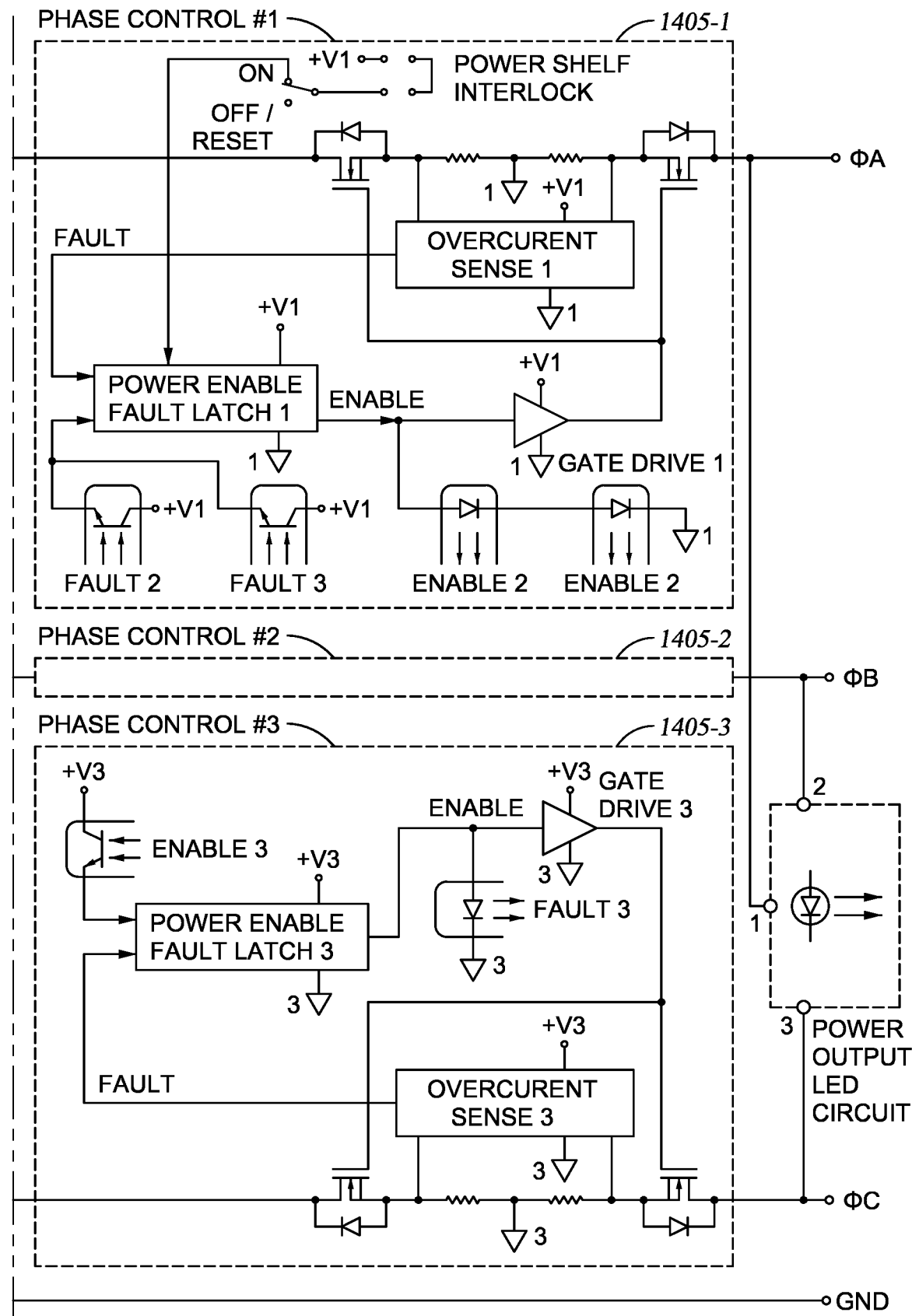

FIGS. 14A, 14B is a diagram 1400 of an exemplary three-phase, three pole electronic circuit breaker, according to one or more embodiments. The diagram 1400 represents a simplified example of how a 3-pole electronic circuit breaker may be powered and controlled for 3-pole current sensing and control with electronic On-Off ganging from each phase to the other phases. The features illustrated in the diagram 1400 may be used in conjunction with other embodiments. For example, the electronic circuit breaker may be associated with FIG. 13 and implemented in the modular PDU 102 shown in any of FIGS. 1A, 1B, 2, 3, 4, 5, 6, 7, and 8.

The electronic circuit breaker comprises phase control circuitry 1405-1, 1405-2, 1405-3 for overcurrent sense control protection on each of the phases of the three-phase input. Any overcurrent sense limit fault will Turn-Off (open) the associated MOSFET switches in the electronic circuit breaker to latched-Off phase power. Also the power tray/shelf interlock pins need to be connected and shorted when fully engaged and the power switch Enable-On/Off-Reset needs to be On to phase control circuitry 1405-1 or the fault latch will be energized. During any latched-Off condition of any 3-phase control circuit, optical controlled fault signals to the master Phase Control #1 1405-1 will disable the enable optical coupler signals to the other phase control circuits causing a fault latched-Off to each other phase control circuit. To reset the latched fault conditions on the 3-Phase control circuits, the power switch Enable-On/Off-Reset needs to be switched to the On-Reset position and then to the Enable-On, or the input power switch needs to be switched to Off-Reset and to Enable-On to reset the latch of the phase control circuitry 1405-1 which will enable and reset the other phase fault latches with AC input power from any one pair of the three input phases through the 3-Phase full-bridge rectifiers. Power input and output LED-type indicators are powered from any one of the 3 phase pairs through 3-Phase full-bridge rectifiers. Input 3-Phase 4-Wire power comes into the PDU with the earth ground wire connected to the PDU case ground and carried through the output connector to the power tray/shelf case ground.

Beneficially, this configuration of the electronic circuit breaker may be implemented with fewer back-to-back MOSFETs.

Thus, the embodiments of the modular PDU described herein support a redundant AC power tray (or power shelf) for higher-power applications. The modular PDU may provide phase balancing for one or more three-phase inputs.

In some embodiments, the modular PDU provides three, six, or nine inputs per power tray on each redundant input for three-phase current balancing, assuming that the PSUs are populated and operating with equal current sharing to a system load.

In some embodiments, one redundant line input is provided per PSU requiring half the PSUs on each redundant input (e.g., multiple power buses).

In some embodiments, two redundant line inputs per PSU requires fewer power supplies.

In some embodiments, the functionality of the PDU may be combined with the power tray. A combined approach addresses the problem with many different input voltages and currents with overcurrent projections and connectors, which conventionally required very large area with many different versions required for provisioning.

In some embodiments, a modular or pluggable PDU connects to the power tray with six PSUs with redundant-input redundant-line PSUs. One example implementation of the power tray may be found in U.S. Pat. No. 10,404,097 entitled "Multi-Input Line-Redundant Uninterruptable Power Supply".

In some embodiments, the PDU may receive inputs at different power levels for provisioning to each power tray to meet PSU power requirements. The different input power levels may include different voltage levels and configurations (delta or wye) specified by different countries or jurisdictions.

Figure 15A:
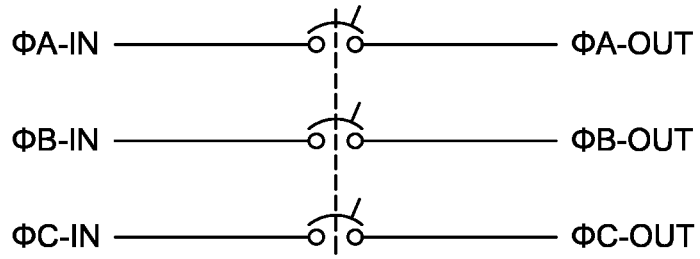
FIGS. 15A-15D illustrate various implementations of three-phase three-pole delta circuit breakers, according to one or more embodiments.
Figure 15B:
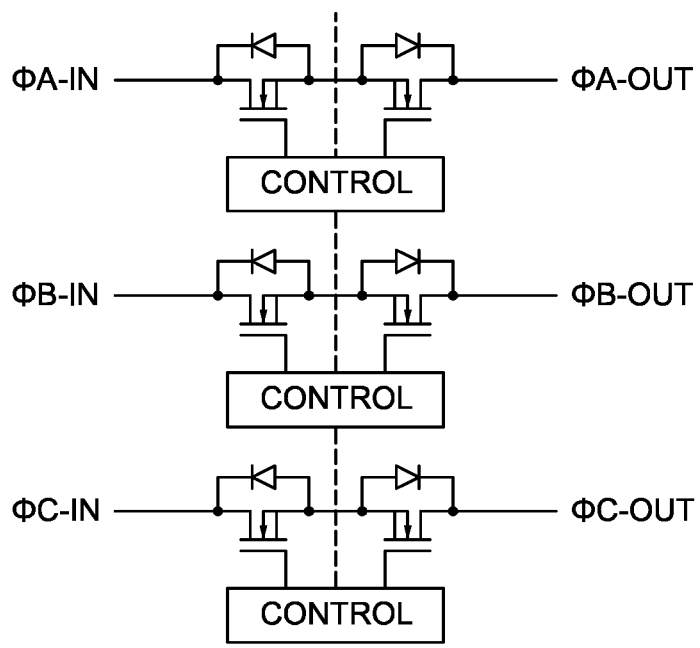
Figure 15C:
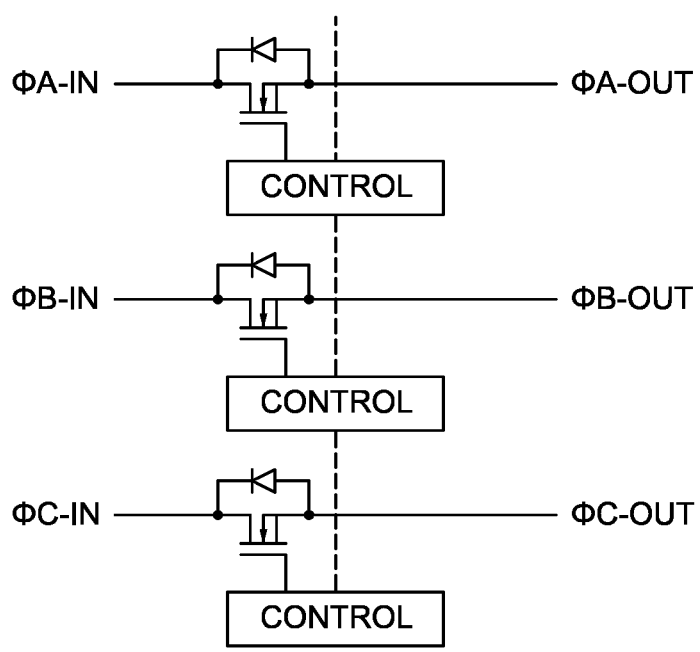
Figure 15D:
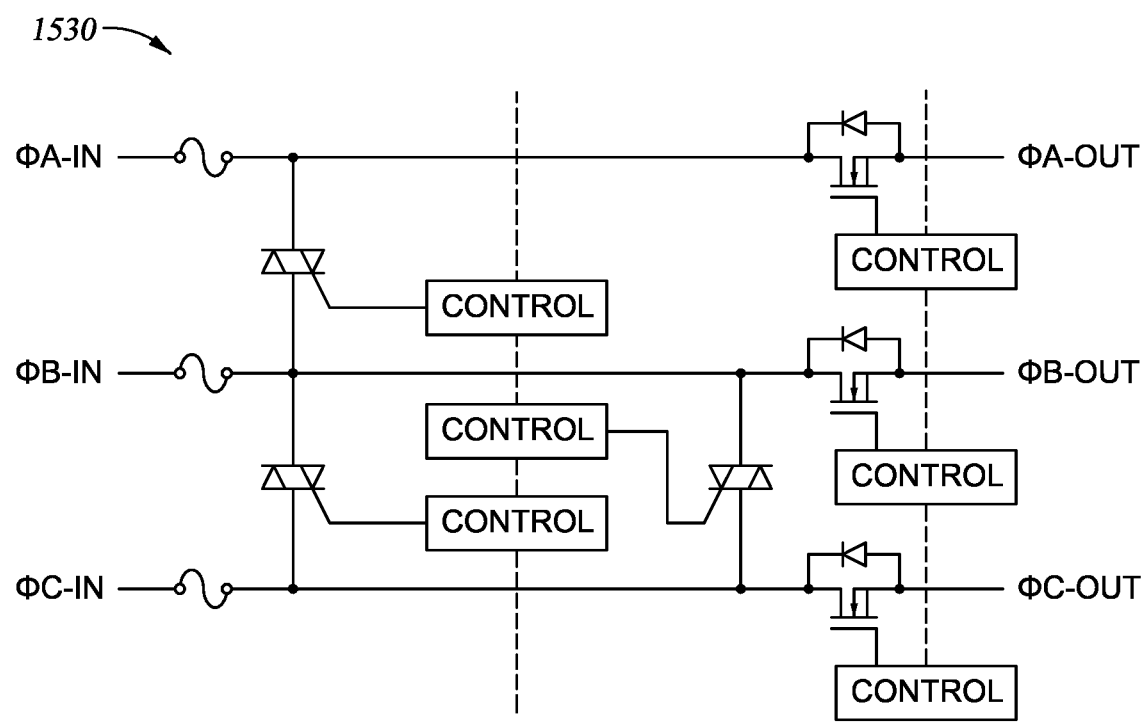

FIGS. 15A-15D illustrate various implementations of three-phase three-pole delta circuit breakers. The features illustrated in FIGS. 15A-15D may be used in conjunction with other embodiments. Diagram 1500 of FIG. 15A illustrates a ganged electro-mechanical circuit breaker. Diagram 1510 of FIG. 15B illustrates a ganged electronic circuit breaker with MOSFETs in a back-to-back configuration with two MOSFETs on each phase for AC isolation, which makes the electronic circuit breaker redundant and tolerant to single points-of-failure to maintain AC isolation between each line to the load(s). Diagram 1520 of FIG. 15C illustrates a ganged electronic circuit breaker with MOSFETs in a back-to-back configuration with one MOSFET between each phase for AC isolation, which makes the electronic circuit breaker non-redundant and not tolerant to a single point-of-failure to maintain AC isolation between each line to the load(s). This is a reduction of series MOSFETs for lower RDSon voltage drop and lower cost with AC isolation, but lacks a single-point-of-failure to maintain AC isolation. Diagram 1530 of FIG. 15D illustrates a ganged electronic circuit breaker with one MOSFETs in a back-to-back configuration between each phase (as in FIG. 15C), but with the capability to provide AC isolation in the case of a MOSFET short circuit failure. The electronic circuit breaker includes three (3) TRIAC-type crowbar circuits to blow fuses to the input phases for AC isolation to the load(s) in case of a MOSFET short circuit failure, thereby providing a single point-of-failure protection for AC isolation with a shorted MOSFET. A shorted MOSFET fault detection circuit shall (not shown) shall monitor the output AC voltage waveform to determine. Sensing of a MOSFET short circuit may be performed before power turn-On is allowed. The sensing of a MOSFET short circuit may be performed of the output AC voltage waveform through a low current sensing circuit for any abnormality of expected voltage isolation of any polarity of input.

Figure 16A:
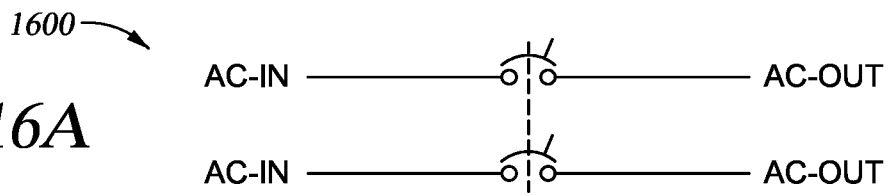
FIGS. 16A-16D illustrate various implementations of one-phase, two-pole+circuit breakers, according to one or more embodiments.
Figure 16B:
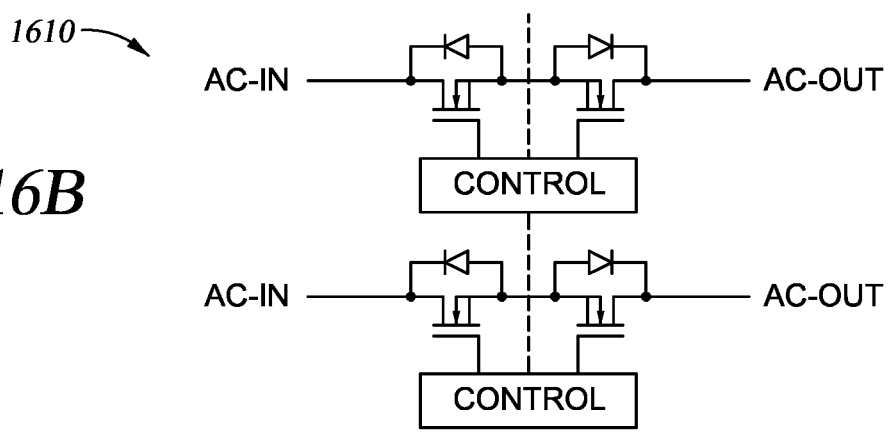
Figure 16C:
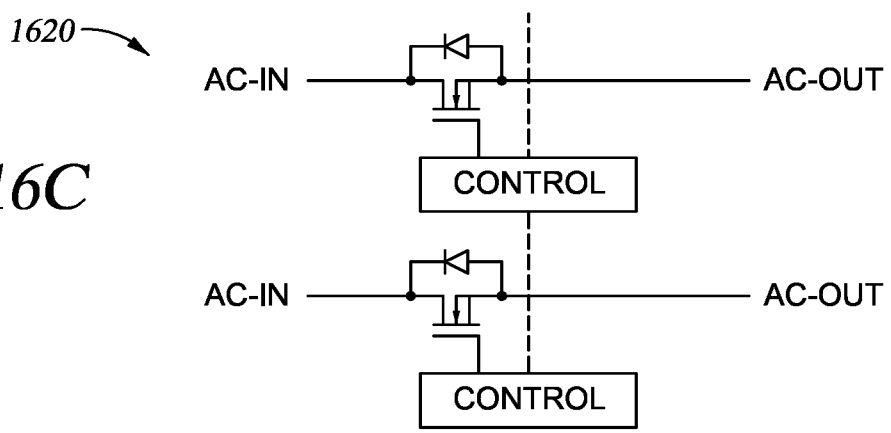
Figure 16D:
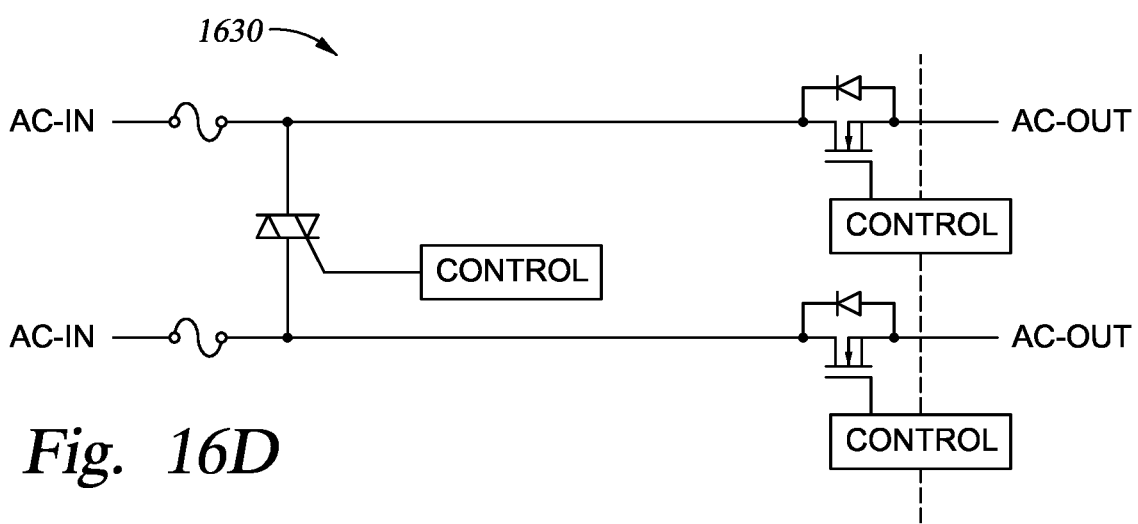

FIGS. 16A-16D illustrate various implementations of one-phase, two-pole circuit breakers. The features illustrated in FIGS. 16A-16D may be used in conjunction with other embodiments. Diagram 1600 of FIG. 16A illustrates a ganged electro-mechanical circuit breaker. Diagram 1610 of FIG. 16B illustrates a ganged electronic circuit breaker with MOSFETs in a back-to-back configuration on each side of the line, which makes the electronic circuit breaker redundant and tolerant to single points-of-failure to maintain AC isolation between each line to the load(s). Diagram 1620 of FIG. 16C illustrates a ganged electronic circuit breaker with MOSFETs in a back-to-back configuration between the input line and the output load(s), which makes the electronic circuit breaker non-redundant and not tolerant to single points-of-failure to maintain AC isolation between each line to the load(s). Diagram 1630 of FIG. 16D illustrates a ganged electronic circuit breaker with MOSFETs in a back-to-back configuration between the line and the load(s) (as in FIG. 16C), but with the capability to provide AC isolation in the case of a MOSFET short circuit failure. The electronic circuit breaker includes TRIAC-type crowbar circuits to blow fuses to the input phases to provide AC isolation to the load(s) in case of a MOSFET short circuit, thereby providing a single point-of-failure protection. This crowbar and blown fuse isolation method is destructive and requires serviceability, so as does the short circuit MOSFET fault condition action that caused the protection method reaction. The electronic circuit breaker may support a DC power input of either polarity or dual polarity with mid-point ground.

Figure 17A:
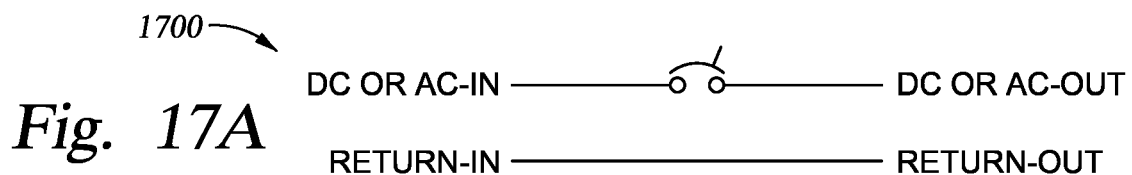
FIGS. 17A-17D illustrate various implementations of one-pole circuit breakers, according to one or more embodiments.
Figure 17B:
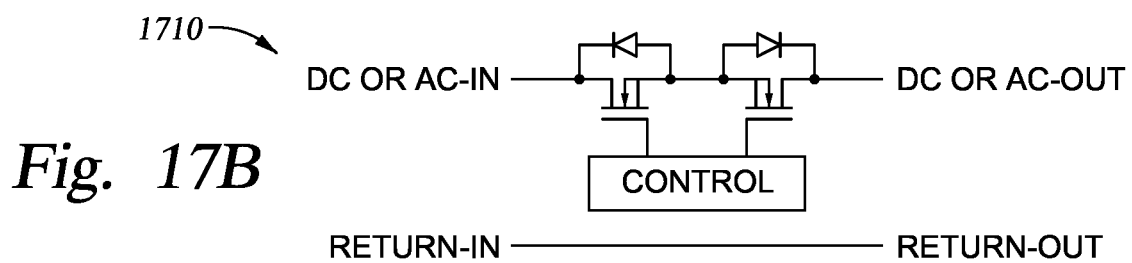
Figure 17C:
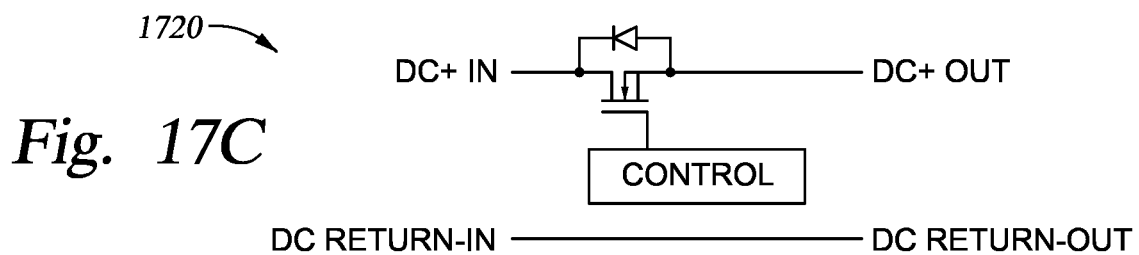
Figure 17D:
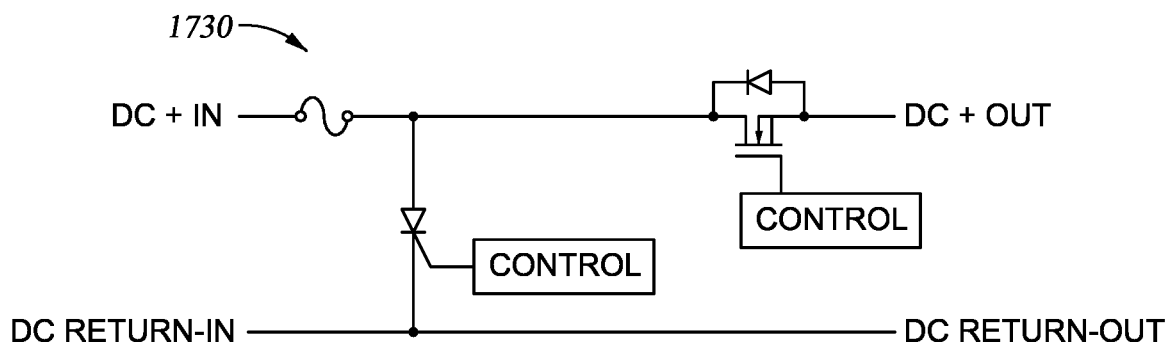
Figure 19A:
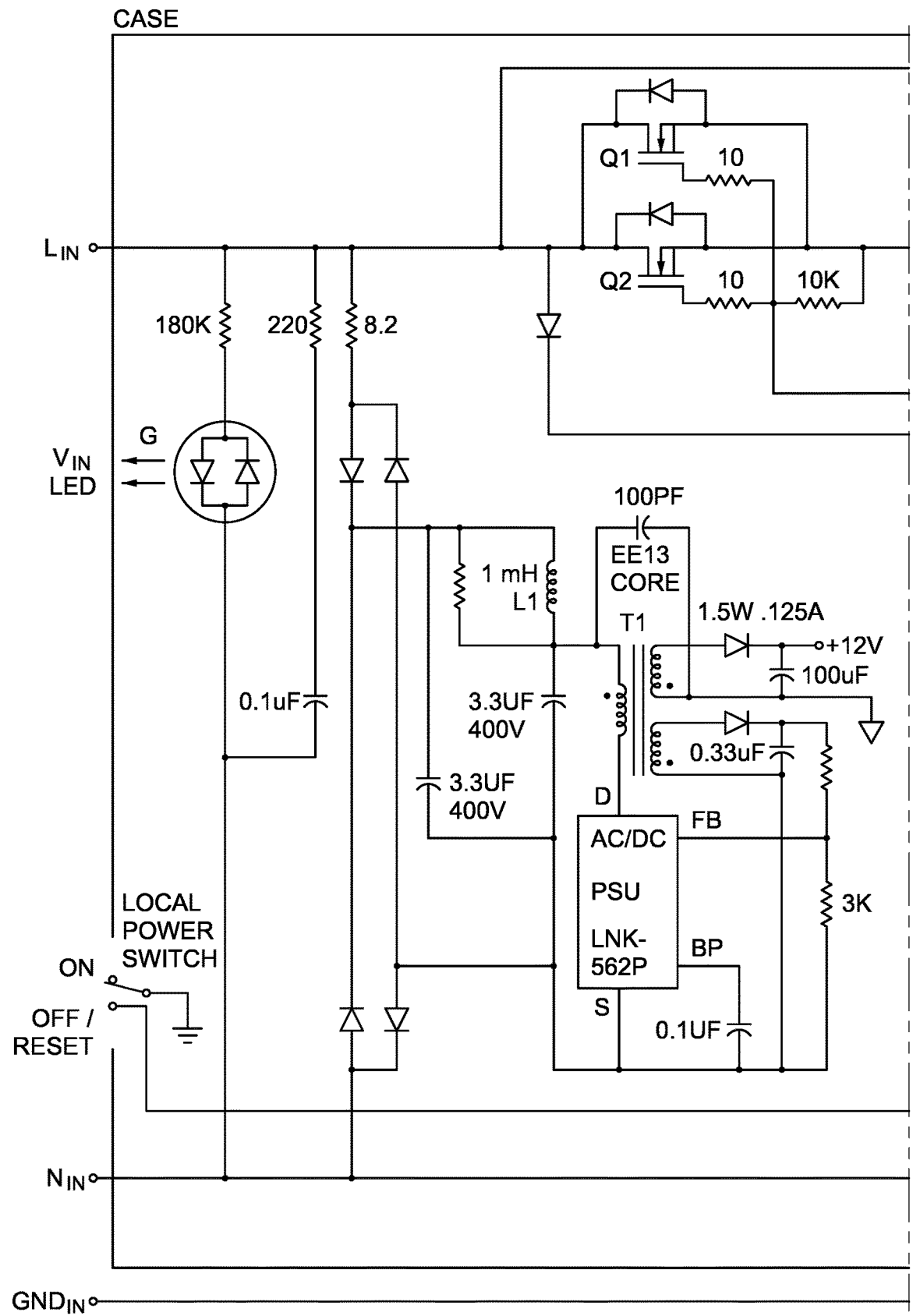
FIGS. 19A-19D is a diagram of an exemplary single-phase electronic circuit breaker control circuit from AC Wye input, according to one or more embodiments.
Figure 19B:
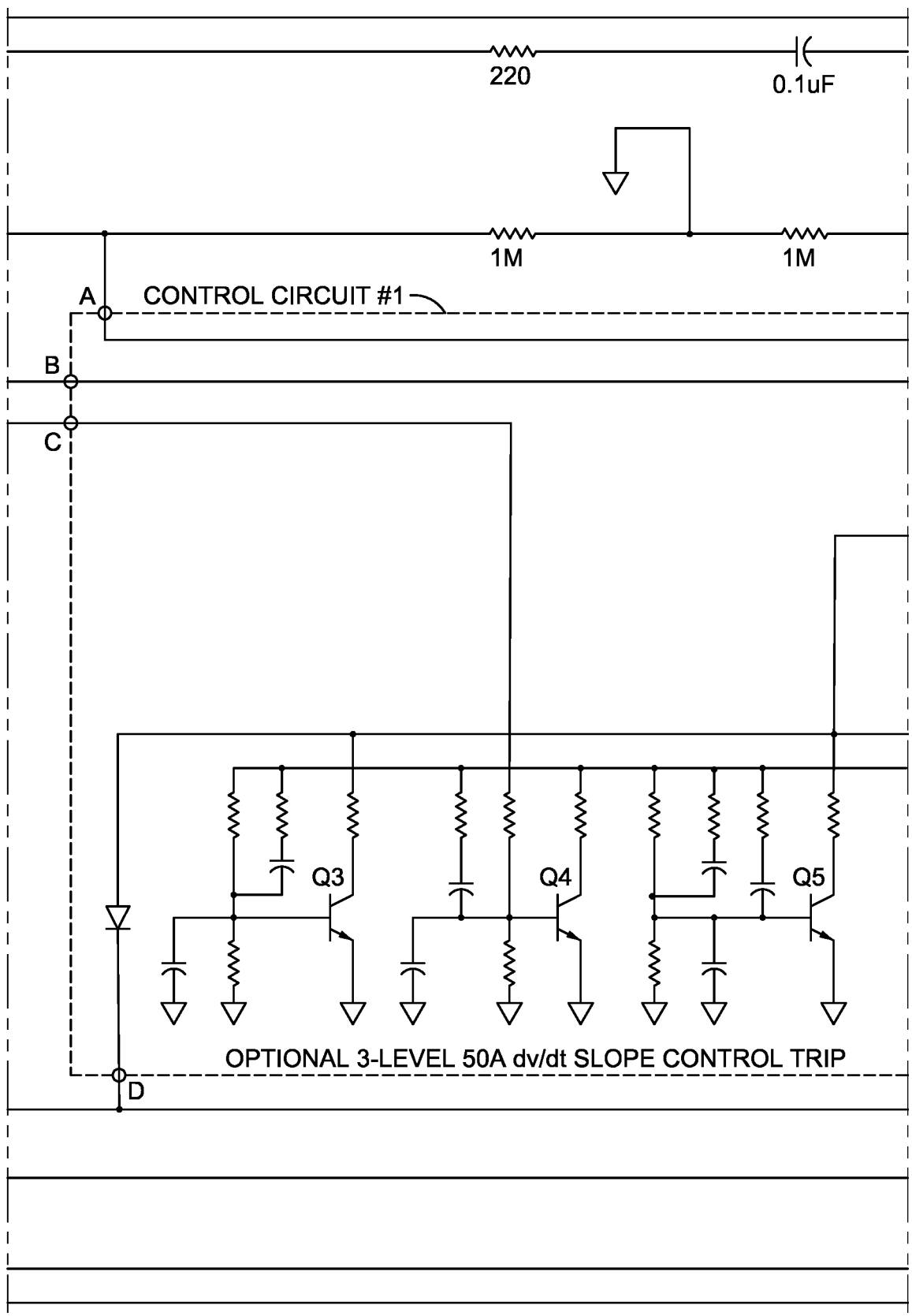
Figure 19C:
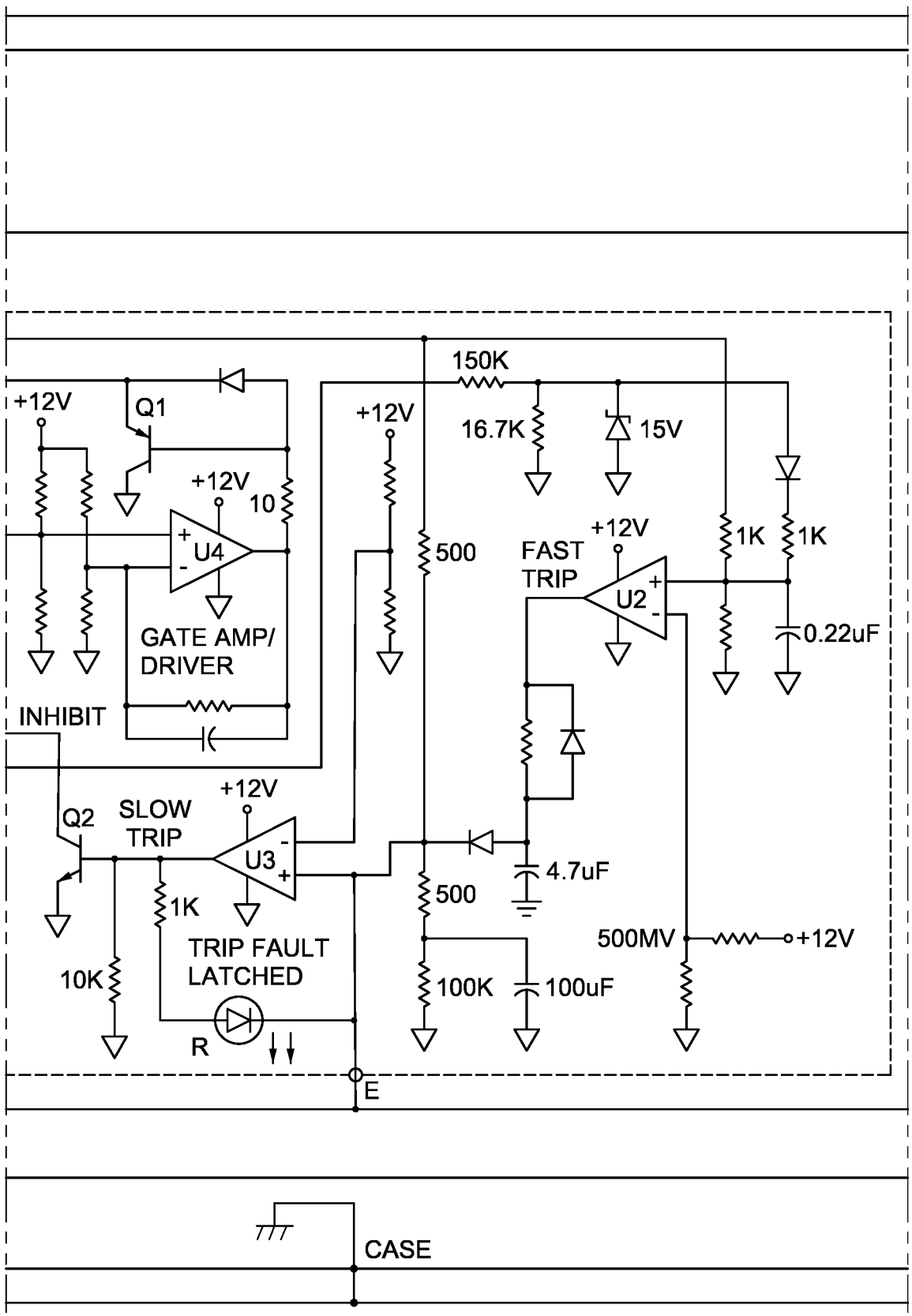
Figure 19D:
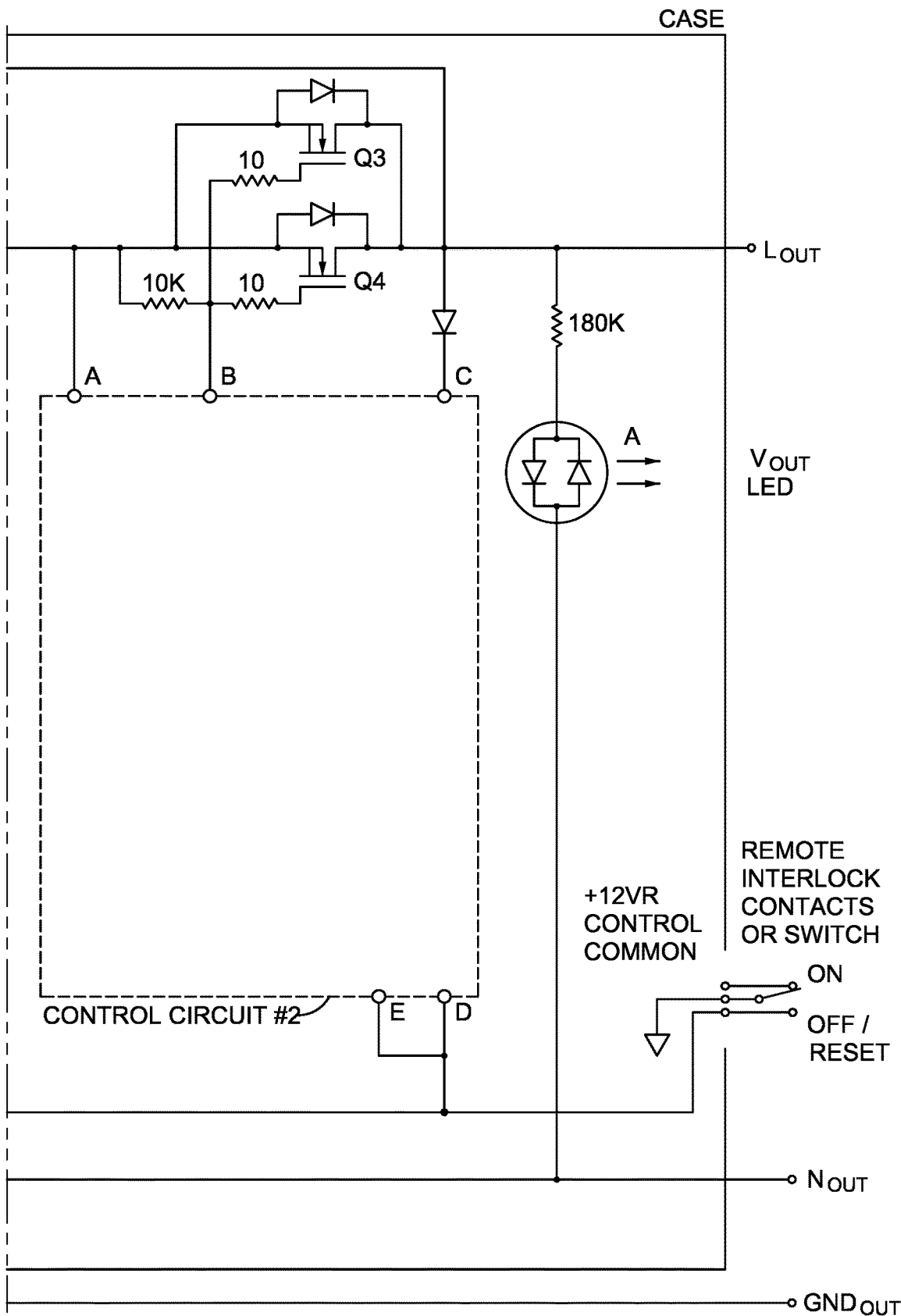

FIGS. 17A-17D illustrate various implementations of one-pole circuit breakers. The features illustrated in FIGS. 17A-17D may be used in conjunction with other embodiments. Diagram 1700 of FIG. 17A illustrates an electro-mechanical circuit breaker supporting AC or DC (either polarity) power input. Diagram 1710 of FIG. 17B illustrates an electronic circuit breaker with MOSFETs in a back-to-back configuration on the high-side (hot) line, which makes the electronic circuit breaker non-redundant and not tolerant to single points-of-failure to maintain AC isolation between each line to the load(s). The electronic circuit breaker supports AC or DC (either polarity) power input. Diagram 1720 of FIG. 17C illustrates an electronic circuit breaker with a MOSFET between the input and output high-side (hot) line DC single polarity input which makes the electronic circuit breaker non-redundant and not tolerant to single points-of-failure to maintain isolation between each line to the load. Diagram 1730 of FIG. 17D illustrates an electronic circuit breaker with a MOSFET between the input and output high-side (hot) line (as in FIG. 17C), but with the capability to provide DC isolation in the case of the MOSFET short circuit failure. The electronic circuit breaker includes a TRIAC-type crowbar circuit to blow a fuse to the input line for AC isolation to the load in case of the MOSFET short circuit, thereby providing a single point-of-failure protection. An SCR-type crowbar circuit may be substituted in FIG. 17D for DC isolation in case of the MOSFET short circuit for single point-of-failure protection.

Thus, implementations are described for a modular power distribution unit (PDU) for a means to interface directly to a power tray or power shelf that may be rack-mountable for power to multiple power supply units (PSUs). The modular PDU includes one or more high power input cables to distribute power to multiple PSUs through the power tray or power shelf. The modular PDU may replace one or more large external PDUs with multiples of power cords into multiple connectors in a power tray or power shelf for the multiple of PSU inputs.

The modular PDU includes a housing defining an input face and an opposing output face, and a one or more input power cables extending to the input face. The modular PDU further includes one or more output power connectors arranged at the output face, and distribution circuitry configured to distribute power from a input power bus(es) to the one or more output power connectors. The modular PDU further includes one or more fasteners configured to attach the output face of the housing to the face of the power tray or power shelf, wherein the one or more output power connectors are retained in a coupled configuration to one or more input power connectors.

In another embodiment the modular PDU may include electro-mechanical or electronic switches or circuit breakers for power control to the power tray or power shelf for the multiple PSU inputs.

In another embodiment the modular PDU electronic switch or circuit breaker may include a 3-Phase Delta input to three 1-Pole ganged electronic circuit breakers with one MOSFET switch on each pole as a back-to-back pair for AC isolation between the input AC phase lines and the output load(s).

In another embodiment the modular PDU electronic switch or circuit breaker may include a 3-Phase Delta input to three 2-Pole ganged electronic circuit breakers with one MOSFET switch on each pole as a back-to-back pair for AC isolation between the input AC phase lines and the output load(s). In another embodiment the configuration of 6 MOSFET switches require 6 isolated gate power supplies and 6 gate drives. In another embodiment the 6 MOSFET switches only require 3 isolated gate power supplies and 6 gate drives. These configurations may also be used for DC inputs with either polarity including mid-point-ground with plus and minus inputs.

In another embodiment the modular PDU electronic switch or circuit breaker may include single or split phase input to a 2-Pole ganged electronic circuit breakers with one MOSFET switch on each pole as a back-to-back pair for AC isolation between the input AC phase lines and the output load(s).

In the embodiments with one MOSFET per pole or line side with AC isolation, there is no single-point-of-failure tolerance for AC isolation between the input and the output load(s). Other embodiments provide a fuse input to the MOSFET pole with a crowbar circuit that is shorts the input line after the fuse to clear the fuse and open the input circuit for AC isolation when a shorted MOSFET is detected.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

As will be appreciated by one skilled in the art, the embodiments disclosed herein may be embodied as a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Program code embodied on a computer readable medium may be transmitted using any appropriate medium, including but not limited to wireless, wireline, optical fiber cable, RF, etc., or any suitable combination of the foregoing.

Computer program code for carrying out operations for embodiments of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described herein with reference to flowchart illustrations and/or block diagrams of methods, apparatuses (systems), and computer program products according to embodiments presented in this disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the block(s) of the flowchart illustrations and/or block diagrams.

These computer program instructions may also be stored in a computer readable medium that can direct a computer, other programmable data processing apparatus, or other device to function in a particular manner, such that the instructions stored in the computer readable medium produce an article of manufacture including instructions which implement the function/act specified in the block(s) of the flowchart illustrations and/or block diagrams.

The computer program instructions may also be loaded onto a computer, other programmable data processing apparatus, or other device to cause a series of operational steps to be performed on the computer, other programmable apparatus or other device to produce a computer implemented process such that the instructions which execute on the computer, other programmable data processing apparatus, or other device provide processes for implementing the functions/acts specified in the block(s) of the flowchart illustrations and/or block diagrams.

The flowchart illustrations and block diagrams in the Figures illustrate the architecture, functionality, and operation of possible implementations of systems, methods, and computer program products according to various embodiments. In this regard, each block in the flowchart illustrations or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, can be implemented by special purpose hardware-based systems that perform the specified functions or acts, or combinations of special purpose hardware and computer instructions.

In view of the foregoing, the scope of the present disclosure is determined by the claims that follow.

We claim:
1. A system comprising:
    a rack-mountable power tray or power shelf comprising:
        a plurality of power supply units (PSUs);
        one or more first power connectors arranged at a face of the power tray or power shelf and coupled to the PSUs; and
    a modular power distribution unit (PDU) comprising:
        a housing defining an input face and an opposing output face;
        a plurality of power cables extending to the input face, wherein the plurality of power cables comprises a first power cable of a first power bus and a second power cable of a second power bus;
        one or more second power connectors arranged at the output face;
        distribution circuitry configured to distribute power from the first power bus and the second power bus to the one or more second power connectors; and
        one or more fasteners configured to attach the output face of the housing to the face of the power tray or power shelf, wherein the one or more second power connectors are retained in a coupled configuration with the one or more first power connectors.

2. The system of claim 1, wherein a count of the one or more second power connectors is greater than a count of the one or more first power connectors.

3. The system of claim 2, wherein the first power bus and the second power bus each provide three-phase power, and wherein the distribution circuitry is configured to distribute, to each of the one or more second power connectors, a respective phase from one of the first power bus and the second power bus.

4. The system of claim 2, wherein the first power bus and the second power bus each provide direct current (DC) power, and wherein the distribution circuitry is configured to distribute, to each of the one or more second power connectors, a respective polarity from one of the first power bus and the second power bus.

5. The system of claim 1, wherein the modular PDU further comprises:
    a plurality of electronic or electro-mechanical circuit breakers with electronic ganging control between different phases of power.

6. The system of claim 5, wherein each of the plurality of electronic or electro-mechanical circuit breakers comprises a respective local switch arranged at the input face.

7. The system of claim 5, wherein each of the plurality of electronic or electro-mechanical circuit breakers comprises:
    a single transistor between a first input terminal and a first output terminal; and
    a single transistor between a second input terminal and a second output terminal,
    wherein the electronic ganging control is provided between gate drivers of the single transistors.

8. The system of claim 1, wherein the power tray or power shelf further comprises one or more first power interlock connectors at the face of the power tray or power shelf, wherein the modular PDU further comprises one or more second power interlock connectors at the output face, and wherein the one or more second power interlock connectors are retained in a coupled configuration with the one or more first power interlock connectors when the output face is attached to the face of the power tray.

9. The system of claim 1, wherein the plurality of power cables comprises a plurality of pendant cables that extend into the housing through the input face.

10. The system of claim 1, wherein the plurality of power cables couple to the modular PDU at the input face of the housing.

11. The system of claim 1, wherein the power tray or power shelf further comprises one or more first identifier connectors at the face of the power tray or power shelf, wherein the modular PDU further comprises one or more second identifier connectors at the output face, and wherein the one or more second identifier connectors are retained in a coupled configuration with the one or more first identifier connectors when the output face is attached to the face of the power tray or power shelf.

12. A modular power distribution unit (PDU) to distribute power to a plurality of power supply units (PSUs) arranged in a rack-mountable power tray or power shelf, the modular PDU comprising:
    a housing configured to receive, at an input face, a plurality of power cables comprising:
        a first power cable of a first power bus; and
        a second power cable of a second power bus;
    one or more first power connectors arranged at an output face of the housing opposite the input face, wherein the one or more first power connectors are arranged to couple with one or more second power connectors of the power tray or power shelf;
    distribution circuitry within the housing, wherein the distribution circuitry is configured to distribute power from the first power bus and from the second power bus to each of the plurality of PSUs via a respective one or more of the first power connectors; and
    one or more fasteners configured to attach the output face of the housing to a face of the power tray or power shelf such that the one or more second power connectors are retained in a coupled configuration with the one or more first power connectors.

13. The modular PDU of claim 12, wherein the modular PDU further comprises one or more fasteners configured to attach the housing to the power tray or power shelf.

14. The modular PDU of claim 12, wherein the first power bus and the second power bus each provide three-phase power, wherein the distribution circuitry is further configured to distribute, to each of the plurality of PSUs, one phase from the first power bus and one phase from the second power bus.

15. The modular PDU of claim 12, wherein the plurality of power cables comprises a plurality of pendant cables that extend into the housing through the input face.

16. The modular PDU of claim 12, wherein the plurality of power cables couple to the PDU at the input face of the housing.

17. A modular power distribution unit (PDU) to distribute power to a plurality of power supply units (PSUs) arranged in a rack-mountable power tray or power shelf, the modular PDU comprising:
- a housing configured to receive, at an input face, a plurality of power cables comprising:
  - a first power cable of a first power bus; and
  - a second power cable of a second power bus;
- a plurality of electronic or electro-mechanical circuit breakers, wherein each of the circuit breakers has electronic ganging control between different phases of multi-phase power of one of the first power bus and the second power bus;
- one or more first power connectors arranged at an output face of the housing opposite the input face, wherein the one or more first power connectors are arranged to couple with one or more second power connectors of the power tray or power shelf; and
- one or more fasteners configured to attach the output face of the housing to a face of the power tray or power shelf such that the one or more second power connectors are retained in a coupled configuration with the one or more first power connectors.

18. The modular PDU of claim 17, wherein each of the circuit breakers comprises a respective two-pole circuit breaker, wherein each two-pole circuit breaker comprises a respective pair of transistors, and wherein the electronic ganging control is provided between gate terminals of the transistors of the respective pair.

19. The modular PDU of claim 18, wherein for each pair of transistors, the electronic ganging control comprises multiple gate voltage supplies coupled to the gate terminals of the transistors of the respective pair.

20. The modular PDU of claim 17, wherein the plurality of power cables comprises a plurality of pendant cables that extend into the housing through the input face.

* * * * *